United States Patent
Yamamoto et al.

(10) Patent No.: US 8,400,748 B2
(45) Date of Patent: Mar. 19, 2013

(54) MAGNETIC COUPLER DEVICE AND MAGNETICALLY COUPLED ISOLATOR

(75) Inventors: Masaaki Yamamoto, Kyoto (JP); Yuichi Kariya, Kyoto (JP); Katsuhisa Toshima, Sendai (JP); Nobukiyo Kobayashi, Sendai (JP); Takeshi Yano, Sendai (JP)

(73) Assignees: OMRON Corporation, Kyoto (JP); The Research Institute for Electric and Magnetic Materials, Miyagi (JP)

( * ) Notice: Subject to any disclaimer, the term of this patent is extended or adjusted under 35 U.S.C. 154(b) by 604 days.

(21) Appl. No.: 12/531,042

(22) PCT Filed: Jan. 31, 2008

(86) PCT No.: PCT/JP2008/051524
§ 371 (c)(1),
(2), (4) Date: Oct. 9, 2009

(87) PCT Pub. No.: WO2008/111336
PCT Pub. Date: Sep. 18, 2008

(65) Prior Publication Data
US 2010/0134944 A1    Jun. 3, 2010

(30) Foreign Application Priority Data

Mar. 12, 2007    (JP) .................. 2007-062035

(51) Int. Cl.
*H01H 47/00* (2006.01)
(52) U.S. Cl. ...................................... 361/143
(58) Field of Classification Search .............. 361/143
See application file for complete search history.

(56) References Cited

U.S. PATENT DOCUMENTS

| 6,054,780 | A | 4/2000 | Haigh et al. |
| 6,376,933 | B1* | 4/2002 | Goetz et al. ............... 307/91 |
| 2006/0114098 | A1 | 6/2006 | Shoji |

FOREIGN PATENT DOCUMENTS

| DE | 44 46 313 | * 12/1994 |
| EP | 1 388 988 A2 | 2/2004 |
| EP | 1 677 119 A2 | 7/2006 |

(Continued)

OTHER PUBLICATIONS

PCT Notification of Transmittal of Translation of the International Preliminary Report on Patentatbility and the Written Opinion of The ISA, issued for International application No. PCT/JP2008/051524, dated Oct. 8, 2009, 6 pages.

(Continued)

*Primary Examiner* — Jared Fureman
*Assistant Examiner* — Nicholas Ieva
(74) *Attorney, Agent, or Firm* — Osha Liang LLP

(57) ABSTRACT

In a magnetic coupler device comprising: a magnetic field generation circuit generating a magnetic field according to an input current; and a detection bridge circuit including a pair of magnetoresistance effect devices, a resistance value of each of the magnetoresistance effect devices changing by applying a magnetic field generated by said magnetic field generation circuit to each of the magnetoresistance effect devices, and having two outputs between which a voltage difference is generated according to an intensity of the magnetic field generated by said magnetic field generation circuit, by forming a geometric shape of each of said magnetic field generation circuit and said detection bridge circuit in line symmetric or point symmetric, a high S/N ratio is obtained even with high frequency.

10 Claims, 19 Drawing Sheets

FOREIGN PATENT DOCUMENTS

| JP | 2000-516714 A | 12/2000 |
|---|---|---|
| JP | 2001-135537 A | 5/2001 |
| JP | 2001-521160 A | 11/2001 |
| JP | 2003-526083 A | 9/2003 |
| JP | 2005-515667 A | 5/2005 |
| JP | 2005-257605 A | 9/2005 |
| JP | 2006-153697 A | 6/2006 |
| WO | 99/21332 A1 | 4/1999 |
| WO | 2006/098372 A1 | 9/2006 |
| WO | WO 2006/098372 * | 9/2006 |

OTHER PUBLICATIONS

Abstract of JP2001-135537, published on May 18, 2001, downloaded from the esp@cenet database—Worldwide, 1 page.

Abstract of WO2006/098372, published on Sep. 21, 2006, from esp@cenet.com, with attachment, 5 pages.

Abstract of JP2005-257605, published on Sep. 22, 2005, downloaded from the esp@cenet database—Worldwide, 1 page.

Abstract of JP2006-153697, published on Jun. 15, 2006, downloaded from the esp@cenet database—Worldwide, 1 page.

Abstract of JP2001-521160, published on Nov. 6, 2001, downloaded from the esp@cenet database—Worldwide, 1 page.

Abstract of JP2003-526083, published on Sep. 2, 2003, downloaded from the esp@cenet database—Worldwide, 1 page.

Abstract of JP2000-516714, published on Dec. 12, 2000, downloaded from the esp@cenet database—Worldwide, 1 page.

Abstract of JP2005-515667, published on May 26, 2005, downloaded from the esp@cenet database—Worldwide, 1 page.

International Search Report issued in PCT/JP2008/051524, mailed on May 1, 2008, with translation, 7 pages.

* cited by examiner

MAGNETIC COUPLER DEVICE AND MAGNETICALLY COUPLED ISOLATOR

TECHNICAL FIELD

The present invention relates to a magnetic coupler device (an insulating interface device or an isolation device) and a magnetically coupled isolator.

BACKGROUND ART

A magnetic coupler device is used as an isolator or the like for transmitting digital signals or analog signals. For example, the magnetic coupler device is applied to an interface that connects a computer to a peripheral device of the computer, an interface that connects circuits having different potentials to each other, an interface in a relay transfer device on a communication network or the like.

If a signal is to be transmitted between the circuits having different potentials, it is necessary to provide an interface for electrically isolating input and output sides from each other and, at the same time, for passing the input signal through an insulator by some means and supplying the input signal to the output side. Generally, a method of passing the input signal through the insulator is roughly classified into three types. Namely, the three types are methods using light, magnetic field and electric field, respectively. As an optically coupled isolator using light, there is known a photocoupler. As a magnetically coupled isolator using a magnetic field, there is known a GMR isolator that employs a pulse transformer or a giant magneto-resistance (GMR) device. As an electric field coupled isolator using an electric field, there is known a capacitively coupled isolator that employs a very small capacitance of an insulator between input and output sides.

The isolators of these types are all insulating interfaces including both an electrically insulating function and a signal coupling function between the input and output sides. While coupling using the light is immune to the influence of the electric field or magnetic field from outside, coupling using the magnetic field or the electric field has a great improvement in a transmission rate from the coupling using the light.

The photocoupler is configured to mainly include a light emitting diode (LED) and a photodetector, and an input side and an output side of the photocoupler are electrically isolated from each other by resin. If current is applied to the LED, then the LED emits light and the light arrives at the photodetector via the resin. Frequency characteristics of the photocoupler are flat from DC up to a given frequency, and the transmission rate is decided depending on various characteristics of internal optical devices or the like and has its limits to several tens of Mbps in digital transmission.

The pulse transformer is to transmit a signal by electromagnetic induction between a primary coil and a secondary coil. The pulse transformer exhibits high transmission efficiency and can realize two-way communication. As for frequency characteristics, the pulse transformer cannot transmit DC for the following reasons. The secondary coil detects a magnetic field change generated by a current change of the primary coil as a current change. Accordingly, the pulse transformer cannot transmit a DC signal that is not accompanied by current change. It is considered that a limit to acceleration of the pulse transformer depends on a magnetic material of a core. Moreover, a transmission frequency band is defined to be up to 100 MHz in a currently popular gigabit LAN according to standards. Therefore, to realize one Gbps, four lines each at a transmission rate of 250 Mbps are employed and multi-leveling (to five levels) is carried out per line. Namely, if an operating rate of the pulse transformer used in the network is applied to the transmission frequency band of the gigabit LAN, the operating rate is about 125 Mbps for binary digital transmission.

The GMR isolator can be regarded as a device obtained by replacing the secondary coil of the pulse transformer by a magnetic field sensor that employs a GMR device. Since the GMR device detects a magnetic field intensity change generated by an input current change as a resistance value change, the GMR isolator can transmit a DC signal. Although it is basically difficult for a transmission rate of the GMR isolator to exceed that of the pulse transformer, the GMR isolator can realize the transmission rate of 100 Mbps in digital transmission. Because of flat frequency characteristics of the GMR isolator from DC up to a given frequency as compared with those of the pulse transformer, the GMR isolator is considered to be a high-rate isolation device that can replace the photocoupler and can be expressed as "magnetic coupler" in a narrow sense.

The capacitively coupled isolator is to transmit a signal through a small capacitance of the insulator between the input and output sides. Since the same path is shared between the signal and noise, it is necessary to set a frequency band of the signal higher than that of the noise. Namely, the small capacitance of the isolator makes it easy to pass the signal through the isolator and difficult to pass the noise through the isolator. Accordingly, frequency characteristics of the capacitively coupled isolator are limited to a high frequency band and the capacitively coupled isolator cannot transmit DC. The capacitively-coupled isolator realizes a transmission rate of 150 Mbps in digital transmission.

One of backgrounds of need to accelerate transmission rates of these insulating interfaces is as follows. Because high-rate microcomputers, DSP and FPGA emerge to follow development of semiconductor technology, accuracy for device control is increasingly improved and acceleration is increasingly improved. On the other hand, high-rate microcomputers become noise sources and have growing influence on peripherals (such as an analog circuit). Accordingly, it is desired to satisfy both acceleration of the interface device and enhancement of isolating properties of the interface device so as to improve the accuracy and to accelerate transmission rates of devices in the future.

To realize the acceleration in digital transmission, it is necessary to reduce an S/N ratio, carry out multi-leveling and widen the transmission frequency band. On the other hand, it is necessary to solve the problem that DC signals cannot be transmitted. There is no need to transmit a DC signal if the pulse transformer is employed in the network. However, for other usages of the pulse transformer, it is required to transmit digital signals as they are without encoding them if digital signals at the same level are continuously transmitted for certain time, or it is required to transmit an analog signal waveform as it is. To realize the requirements, it is necessary to transmit DC signals. If DC signals are to be transmitted using the capacitively coupled isolator, a transmission method by converting each DC signal into a pulse width modulated (PWM) signal may be used. However, in this case, it is necessary to separately construct a circuit system for conversion. In such usages, the GMR isolator is advantageous over the other types of isolators because DC signals can be transmitted and a frequency band of the GMR isolator is wide.

As a conventional GMR isolator, there is known a GMR isolator configured so that an electrostatic shield is provided between a spiral input coil and a magnetic field sensor that employs a GMR device and the electrostatic shield is grounded, thereby reducing floating capacitance between the input and output sides (see Patent Documents 1 and 2). This technique can suppress noises generated on output sides if voltage suddenly changes between the input and output sides. Namely, the conventional GMR isolator uses the fact that capability to eliminate common mode signals between the input and output sides can be improved.

The problem with the GMR isolator is that the transmission rate cannot be accelerated to be equal to or higher than 100 Mbps. If the transmission rate is accelerated, a high frequency signal carried across the input coil generates noise in an output-side magnetic field sensor due to induced voltage. The electrostatic shield between the input coil and the magnetic field sensor can suppress the noise due to the induced voltage. However, since the electrostatic shield is a conductor, a magnetic field from the input coil generates eddy current in a direction of canceling magnetic field change. As a result, the magnetic field disadvantageously attenuates. If the magnetic field attenuates, a quality of a signal waveform is degraded by a reduction in the S/N ratio following lowering of signal level, which possibly causes circuit malfunction.

Furthermore, the conventional GMR isolator has the following problems in arrangement, structure and the like of the input coil and the magnetic field sensor if designed for higher frequency. As shown in FIG. 20, the conventional GMR isolator includes a magnetic coupler device 103 configured to include an input coil 101 and a Wheatstone bridge that includes a GMR device serving as a detection circuit 102, and a differential receiver (differential amplifier) 104 calculating a difference between two outputs from the magnetic coupler device and amplifying the difference. The magnetic coupler device 103 can be regarded as a device having one input port and two output ports. The differential receiver 104 calculates the difference between two differential signals output from the two output ports and opposite in phase in the detection circuit 102, that is, the Wheatstone bridge, thereby making it possible to reduce common mode noise. However, the input port is connected to each of the output ports not only magnetically but also capacitively and inductively. Therefore, if frequency is higher, a difference of impedance between the input port and one of the two output ports and that between the input port and the other output port is greater and asymmetric normal mode noises that the differential receiver 104 cannot eliminate are output to the two output ports, respectively.

A transmission rate C (bit/sec.) in digital transmission is decided by a frequency bandwidth B and a signal-to-noise ratio (S/N ratio) according to Shannon's theorem expressed by the following Equation (1).

$$C = B\log_2\left(1 + \frac{S}{N}\right) \quad (1)$$

According to this Equation (1), if the S/N ratio is high, the transmission rate can be accelerated by multi-leveling transmission. Considering how much the frequency band should be secured for a device having a fixed transmission rate, if the transmission rate C is set constant, the frequency band B can be suppressed by multi-leveling as long as the S/N ratio is high. Generally, however, if a transmission rate of a device is to be accelerated, binary digital transmission is basically adopted. In addition, to realize highly reliable digital transmission, the device is often developed while setting a larger bandwidth for the transmission rate. For example, if the binary digital transmission is performed by a pulse waveform, high reliability can be ensured by securing a transmission frequency band about three times as large as the transmission rate. Namely, to realize the transmission rate of 100 Mbps, a frequency bandwidth from DC to about 300 MHz is set as a guide.

If attention is paid to transmission frequency characteristics of the device, as a frequency is higher than around several tens of MHz, symmetry as a transmission circuit seen from two output terminals is gradually destroyed and noises resulting from the induced voltages are greater. The S/N ratio is reduced, accordingly. Considering these problems, there is proposed a method of increasing the transmission rate by multi-leveling while restricting the frequency band and securing the S/N ratio. Nevertheless, because of need to realize the highly reliable digital transmission, there is a limit to acceleration by multi-leveling. It is, therefore, necessary to widen the frequency band so as to accelerate the transmission rate.

Namely, if the transmission rate is equal to or lower than 100 Mbps, the device can be designed easily while ignoring asymmetry as a transmission circuit without influence of the noises resulting from induced voltages by suppressing the transmission frequency band. However, if the transmission rate is equal to or higher than 100 Mbps, limits occur to multi-leveling while suppressing the transmission frequency and, therefore, there is no avoiding widening the frequency band to higher frequency side. If the frequency band is widened to the higher frequency side, the influence of the noises resulting from two different induced voltages due to the asymmetry as the transmission circuit is gradually greater, accordingly, which thus disturbs acceleration of the transmission rate. Moreover, the noises resulting from the induced voltages can be reduced by inserting the electrostatic shield into the conventional GMR isolator but the asymmetry as the transmission circuit remains unchanged even by insertion of the electrostatic shield. As a result, if the transmission frequency band is widened to the higher frequency side to accelerate the transmission rate, there eventually comes a limit to reducing the noises by inserting the electrostatic shield.

Causes for occurrence of the induced voltages at the output terminals can be roughly classified into two types, that is, capacitive coupling and mutual inductance-related coupling. The former coupling derives from a path of floating capacitance between the input and output sides whereas the latter coupling is electromagnetic inductive coupling between an input-side conductor and an output-side sensor conductor. In reality, the floating capacitance between the input and output sides is left even if the electrostatic shield is provided. Moreover, as for the mutual inductance-related coupling between the input and output sides, overcurrent is generated in the output-side sensor conductor by applying an alternating-current magnetic field to the input side. It is considered that the induced voltages occur to the output sides, depending on circuit arrangement on the output sides. The influence of these causes for occurrence becomes greater if the frequency is higher.

Patent Document 1: Patent Application Publication No. 2001-521160.

Patent Document 2: Patent Application Publication No. 2003-526083.

Patent Document 3: Patent Application Publication No. 2000-516714.

Patent Document 4: Patent Application Publication No. 2005-515667.

SUMMARY OF THE INVENTION

One or more embodiments of the present invention provide a magnetic coupler device and a magnetically coupled isolator capable of ensuring a high S/N ratio even if frequency is high.

In one or more embodiments, a magnetic coupler device according to the present invention includes: a magnetic field generation circuit generating a magnetic field according to an input current; and a detection bridge circuit including a pair of magnetoresistance effect devices, a resistance value of each of the magnetoresistance effect devices changing by applying a magnetic field generated by the magnetic field generation circuit to each of the magnetoresistance effect devices, and having two outputs between which a voltage difference is generated according to an intensity of the magnetic field generated by the magnetic field generation circuit, wherein a geometric shape of each of the magnetic field generation circuit and the detection bridge circuit is formed to be line symmetric or point symmetric.

With this constitution, capacitive coupling and inductive coupling between an input of a magnetic field generation circuit pattern and one of the two outputs of the detection bridge circuit is identical to that between the input and the other output thereof. Due to this, even if a high frequency signal is input, generated noises are common in mode and identical in waveform. It is, therefore, possible to obtain a noise-free output by calculating a difference between the two outputs of the detection bridge circuit irrespectively of the frequency.

Further, in the magnetic coupler device according to the present invention, the magnetic field generation circuit may include two exciting coils electrically connected to each other and having geometric shapes symmetric to each other.

With this constitution, it is possible to facilitate making a primary-side circuit geometrically symmetric by dividing one coil into two.

Moreover, in the magnetic coupler device according to the present invention, one end of each of the two exciting coils may be connected to the same electrode and the two exciting coils may be formed to be line symmetric about a line passing the electrode.

With this constitution, the magnetic field generation circuit and the detection bridge circuit are arranged in a mirrored fashion relatively to an input-side electrode terminal, whereby the magnetic coupler device can be formed to be geometrically symmetric to generate common mode noises on secondary-side outputs, respectively.

In the magnetic coupler device according to the present invention, each of the magnetoresistance effect devices may be configured to include a magnetoresistance effect film; and a pair of conductive connection arms extending from the magnetoresistance effect film in opposite directions to each other, arranged in the magnetic field generated by the magnetic field generation circuit, and each made of a soft magnetic material.

With this constitution, it is possible to form the magnetoresistance effect devices a resistance value of each of which greatly changes according to the magnetic field generated by the magnetic field generation circuit and improve sensitivity of the detection bridge circuit.

Furthermore, in the magnetic coupler device according to the present invention, the detection bridge circuit may include a pair of fixed resistors, and the magnetoresistance effect devices and the fixed resistors may be arranged symmetrically in geometry. Each of the fixed resistors may be configured to include a pair of magnetoresistance effect films; and a pair of conductive connection arms extending from the magnetoresistance effect films in opposite directions, respectively, arranged in the magnetic field generated by the magnetic field generation circuit, and each made of a nonmagnetic material.

With this constitution, by arranging the magnetoresistance effect devices identical in geometric shape and the fixed resistors identical in geometric shape to be symmetric, capacitive and inductive coupling states of coupling the two outputs of the detection bridge circuits to the input of the magnetic field generation circuit can be made identical to each other, noise components of output voltages are common in mode and identical in waveform, and the differential amplifier can cancel the noise components. Further, the magnetoresistance effect devices can be used as the fixed resistors by using the conductive connection arms made of the nonmagnetic material Furthermore, in the magnetic coupler device according to the present invention, the detection bridge circuit may include a pair of fixed resistors connected to the conductive connection arms, respectively outside of the magnetic field generation circuit, and the detection bridge circuit may be formed to be point symmetric about a midpoint between the pair of magnetoresistance effect films.

With this constitution, similarly to the above, the capacitive and inductive coupling states of coupling the two outputs to the input can be made identical to each other, the magnetoresistance effect films can be arranged at diagonal positions in the detection bridge circuit by making the bridge circuit point symmetric, and the potential difference proportional to the intensity of the magnetic field can be generated between the two outputs.

Moreover, in the magnetic coupler device according to the present invention, the detection bridge circuit may include a pair of fixed resistances connected to the conductive connection arms, respectively outside of the magnetic field generation circuit, and the detection bridge circuit may be formed to be line symmetric about a line connecting the pair of magnetoresistance effect films.

With this constitution, similarly to the above, the potential difference proportional to the intensity of the magnetic field can be generated between the two outputs while making the capacitive and inductive coupling states of coupling the two outputs to the input identical to each other.

Furthermore, in the magnetic coupler device according to the present invention, the magnetic field generation circuit may include an exciting coil formed in planer configuration, and the detection bridge circuit may be arranged symmetrically on each of both sides of the exciting coil.

With this constitution, similarly to the above, the potential difference proportional to the intensity of the magnetic field can be generated between the two outputs while making the capacitive and inductive coupling states of coupling the two outputs to the input identical to each other.

Moreover, in the magnetic coupler device according to the present invention, each of the magnetoresistance effect devices may be configured to include a magnetoresistance effect film; and a pair of conductive connection arms extending from the magnetoresistance effect film in opposite directions to each other, arranged in the magnetic field generated by the magnetic field generation circuit, and each made of a soft magnetic material.

With this constitution, it is possible to form the magnetoresistance effect devices a resistance value of each of which greatly changes according to the magnetic field generated by the magnetic field generation circuit and improve sensitivity of the detection bridge circuit.

Furthermore, in the magnetic coupler device according to the present invention, the bridge detection circuit may include a pair of fixed resistors, each of the fixed resistors may include a pair of magnetoresistance effect films; and a pair of conductive connection arms extending from the magnetoresistance effect films in opposite directions to each other, respectively, arranged in the magnetic field generated by the magnetic field generation circuit, and each made of a non-magnetic material, and the magnetoresistance effect films and the fixed resistors may be arranged symmetrically on both sides of the exciting coils.

Moreover, in the magnetic coupler device according to the present invention, the detection bridge circuit may include a pair of fixed resistors connected to the conductive connection arms, respectively outside of the magnetic field generation circuit, and the detection bridge circuit may be formed symmetrically on each of both sides of the exciting coil.

Furthermore, in the magnetic coupler device according to the present invention, the magnetoresistance effect film may be formed out of a nanogranular material containing metal and an insulator.

A magnetically coupled isolator according to the present invention includes: one of the above-stated magnetic coupler devices; and a differential amplifier outputting a difference between the two outputs of the detection bridge circuit, and may further include buffer amplifiers amplifying the two outputs of the detection bridge circuit, respectively. It is to be noted that the differential amplifier is a concept that includes not only an amplifier that can obtain amplification gain but also what does not obtain gain (difference device).

According to one or more embodiments of the present invention, by forming the magnetic field generation circuit and the detection bridge circuit to be geometrically line symmetric or point symmetric, noise components generated by the capacitive coupling and inductive coupling of the two outputs of the detection bridge circuit, between which outputs the potential difference proportional to the intensity of the magnetic field generated by the magnetic field generation coil is generated, to the input can be made common in mode and identical in waveform, and the differential amplifier can cancel noises.

DESCRIPTION OF REFERENCE SYMBOLS

1 Magnetically coupled isolator,
2 Magnetic coupler device,
3 Differential amplifier,
4 Magnetic field generation circuit,
5 Detection bridge circuit,
6, 6a, 6b Input terminal,
7, 7a, 7b Exciting coil,
8, 8a, 8b Ground terminal,
9a, 9b Magnetoresistance effect device,
10 Fixed resistor,
11, 11a, 11b Power supply terminal,
12a, 12b Output terminal,
19a, 19b Magnetoresistance effect film,
20a, 20b Magnetoresistance effect film,
21a, 21b Conductive connection arm,
22a, 22b Conductive connection arm,
23a, 23b Conductive connection arm,
24a, 24b Conductive connection arm,
27 Conductive pattern.

DETAILED DESCRIPTION

Embodiments of the present invention will now be described with reference to the drawings.

Figure 1:
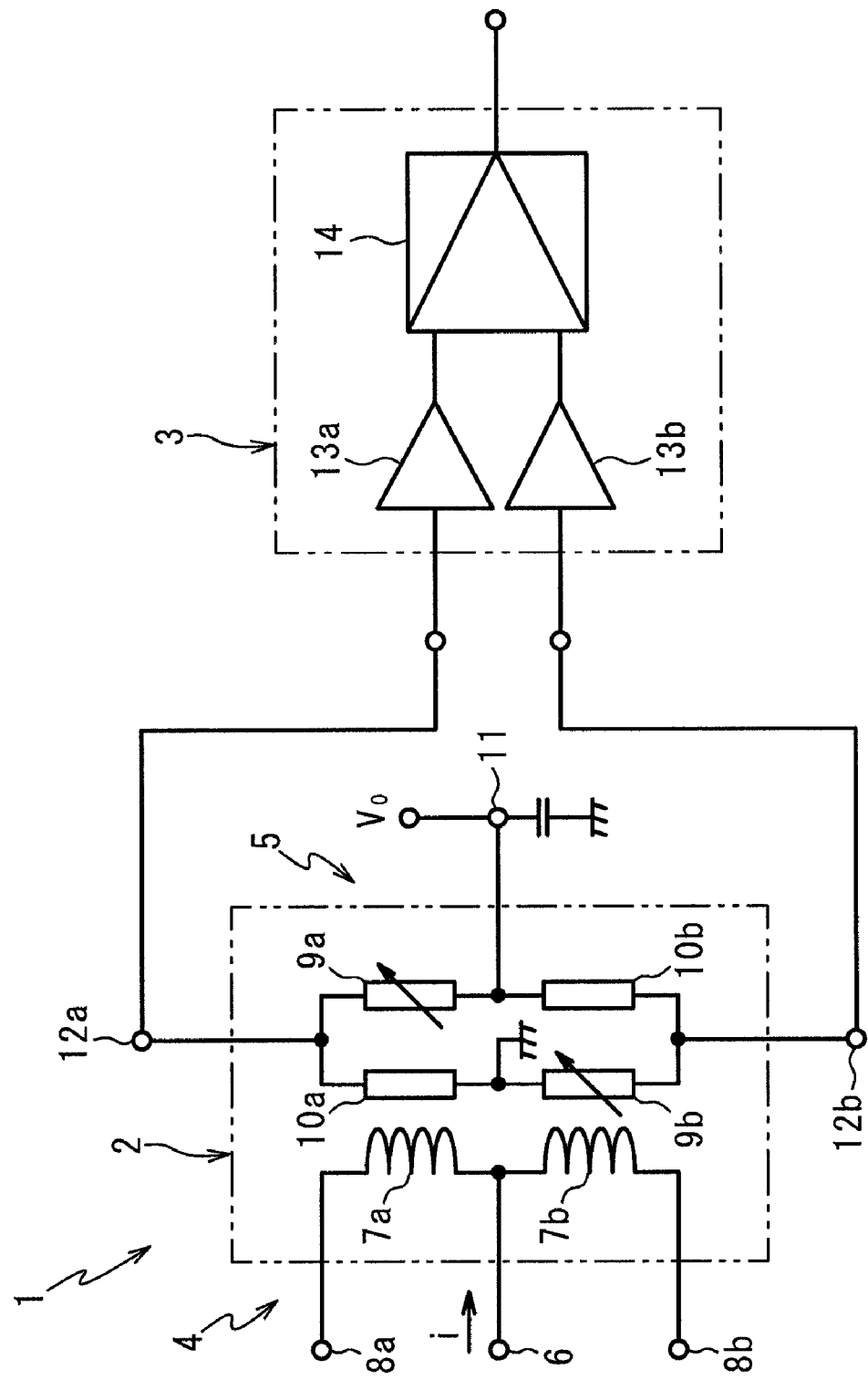
FIG. 1 is a circuit diagram of a magnetically coupled isolator according to a first embodiment of the present invention.

FIG. 1 is a circuit diagram of a magnetically coupled isolator 1 according to a first embodiment of the present invention. The magnetically coupled isolator 1 is configured to include a magnetic coupler device 2 and a differential amplifier 3.

The magnetic coupler device 2 includes a magnetic field generation circuit 4 and a detection bridge circuit 5 grounds (reference potentials) of both of which are separated from each other.

The magnetic field generation circuit 4 includes an input terminal 6 to which a primary-side current i is input, exciting coils 7a and 7b branching from the input terminal 6 and provided electrically in parallel, and ground terminals 8a and 8b grounding currents passed through the exciting coils 7a and 7b, respectively.

The detection bridge circuit 5 is a Wheatstone bridge that includes two magnetoresistance effect devices 9a and 9b and two fixed resistors 10a and 10b. The detection bridge circuit 5 includes a power supply terminal 11 to which a power supply voltage $V_0$ is applied and two detection output terminals 12a and 12b.

The differential amplifier 3 includes buffer amplifiers 13a and 13b amplifying two outputs from the detection bridge circuits 5, respectively and main amplifier 14 amplifying a difference between outputs from the buffer amplifiers 13a and 13b and outputting the amplified difference.

Figure 2:
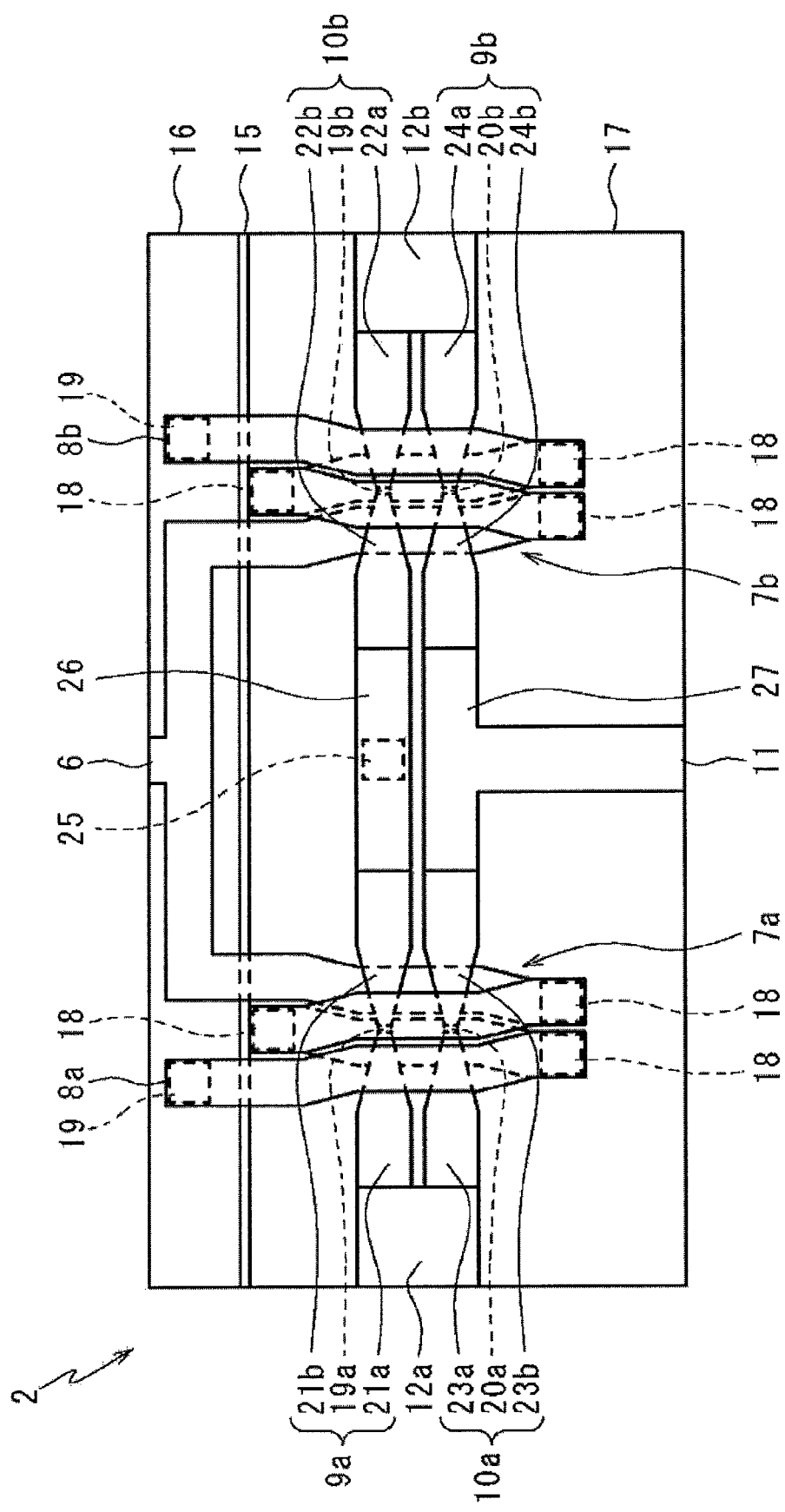
FIG. 2 is a plan view of a magnetic coupler device of the magnetically coupled isolator shown in FIG. 1.

FIG. 2 shows a specific shape of the magnetic coupler device 2 of the magnetically coupled isolator 1 according to this embodiment. The magnetic coupler device 2 is formed by arranging a ground pattern 16 which is a reference point of potential of the magnetic field generation circuit 4 and a ground pattern 17 which is a reference point of potential of the detection bridge circuit 5 on a substrate 15 by photolithographic technique. Furthermore, layers of conductive patterns isolated from one another by insulating films that are not shown, respectively, are formed on the ground pattern 16, substrate 15 and the ground pattern 17, thereby forming the magnetic generation circuit 4 and the detection bridge circuit 5.

As shown in the drawings, the magnetic field generation circuit 4 and the detection bridge circuit 5 of the magnetic coupler device 2 are formed to be line symmetric (in a mirrored fashion) about a line connecting the input terminal 6 to the power supply terminal 11.

On the ground patterns 16 and 17, an insulating film is first formed and a lower-layer conductive pattern of the input terminal 6 of the magnetic field generation circuit 6 and the exciting coils 7a and 7b is then formed. On the lower-layer conductive pattern, the magnetoresistance effect device detection bridge circuit 5 is formed while being isolated from the lower-layer conductive pattern by an insulating film. Moreover, an upper-layer conductive pattern of the ground terminals 8a and 8b of the magnetic field generation circuit 4 and the exciting coils 7a and 7b is formed while being isolated from the detection bridge circuit 5 by an insulating film. The upper-layer conductive pattern of the exciting coils 7a and 7b is connected to the lower-layer conductive pattern thereof by a plurality of coil connection layers 18 penetrating through the insulating films. The exciting coils 7a and 7b that contain a part of the detection bridge circuit 5 are thereby formed three-dimensionally. The ground terminals 8a and 8b formed in the upper-layer conductive pattern are connected to the ground pattern 16 by ground connection layers 19 penetrating through the insulating films, respectively.

The magnetic field generation circuit 4 generates a magnetic field penetrating through the exciting coils 7a and 7b by applying a current to between the input terminal 6 and the ground pattern 16. Although the exciting coils 7a and 7b are formed bilaterally symmetric, directions in which current goes around the respective coils 7a and 7b are the same. Therefore, magnetic fields that the both of the exciting coils 7a and 7b generate are the same in direction.

The detection bridge circuit 5 includes magnetoresistance effect films 19a and 19b and magnetoresistance effect films 20a and 20b arranged to be paired at symmetric positions contained in the exciting coils 7a and 7b, respectively and each made of a nanogranular material containing metal and an insulator. The detection bridge circuit 5 includes conductive connection arms 21a and 21b, conductive connection arms 22a and 22b, conductive connection arms 23a and 23b and conductive connection arms 24a and 24b extending from the magnetoresistance effect films 19a, 19b, 20a and 20b to outside of the exciting coils 7a and 7b in opposite directions along magnetic fields generated by the exciting coils 7a and 7b so as to be paired, respectively. The conductive connection arms 21a and 23a are connected to each other by a conductive pattern in which two terminals protruding from the exciting coil 7a constitute the output terminal 12a. The conductive connection arms 22a and 24a are connected to each other by a conductive pattern in which two terminals protruding from the exciting coil 7b constitute the output terminal 12b. The conductive connection arms 21b and 22b are connected to each other by a ground pattern 26 in which terminals protruding from the exciting coils 7a and 7b, respectively are connected to the ground pattern 17 by a ground connection layer 25 penetrating through the insulating layers. The conductive connection arms 23b and 24b are connected to each other by a conductive pattern 27 which includes the power supply terminal 11 and in which terminals protruding from the exciting coils 7a and 7b, respectively are connected to each other.

The conductive connection arms 21a and 21b and the conductive connection arms 24a and 24b are made of a soft magnetic material, and the conductive connection arms 22a and 22b and the conductive connection arms 23a and 23b are made of a nonmagnetic material. That is, the paired conductive connection arms 21a and 21b and the paired conductive connection arms 22a and 22b or the paired conductive connection arms 23a and 23b and the paired conductive connection arms 24a and 24b located at symmetric positions to one another, respectively form geometric shapes line symmetric to each other but differ in material.

The paired conductive connection arms 21a and 21b and 24a and 24b made of the soft magnetic material guide magnetic fluxes generated by the exciting coils 7a and 7b to apply the magnetic fluxes to the magnetoresistance effect films 20a and 21b, respectively. Therefore, resistance values of the magnetoresistance effect films 20a and 21a increase or decrease at the same rate according to a value of a current input to the input terminal. That is, the conductive connection arms 21a and 21b and the magnetoresistance effect film 19a integrally constitute the magnetoresistance effect device 9a a resistance value of which changes according to an intensity of the magnetic field generated by the exciting coil 7a. The conductive connection arms 24a and 24b and the magnetoresistance effect film 20b integrally constitute the magnetoresistance effect device 9b a resistance value of which changes according to an intensity of the magnetic field generated by the exciting coil 7b.

On the other hand, the paired conductive connection arms 22a and 22b and 23a and 23b made of the nonmagnetic material reject the magnetic fluxes generated by the exciting coils 7a and 7b so as not to apply the magnetic fluxes to the magnetoresistance effect films 20a and 19b, respectively. Accordingly, resistance values of the magnetoresistance effect films 20a and 19b hardly increase or decrease according to the current input to the input terminal. That is, the conductive connection arms 23a and 23b and the magnetoresistance effect film 20a integrally constitute the fixed resistor 10a that is not influenced by the magnetic field generated by the exciting coil 7a. The conductive connection arms 22a and 22b and the magnetoresistance effect film 19b integrally constitute the fixed resistor 10b that is not influenced by the magnetic field generated by the exciting coil 7b.

Therefore, voltages proportional to the value of the current applied to the input terminal 6 are output to the output terminals 12a and 12b of the Wheatstone bridge that are formed by the magnetoresistance effect device 9a and the fixed resistors 10a and by the magnetoresistance effect device 9b and the fixed resistor 10b, by magnetic coupling between the magnetic field generation circuit 4 and the magnetoresistance effect device 9a and that between the magnetic field generation circuit 4 and the magnetoresistance effect device 9b, respectively.

Further, there is no difference between a degree of capacitive coupling and inductive coupling of the magnetoresistance effect device 9a to the magnetic field generation circuit 4 seen from the output terminal 12a and that of capacitive coupling and inductive coupling of the magnetoresistance effect device 9b to the magnetic field generation circuit 4 seen from the output terminal 12b since the magnetic field generation circuit 4 and the detection bridge circuit 5 are constituted to be line symmetric. Thus, noises common in mode and identical in waveform are induced to the output terminals 12a and 12b by the capacitive coupling and the inductive coupling of output sides to an input side. Namely, if the differential amplifier 3 calculates a difference between the voltages from the both output terminals 12a and 12b, the differential amplifier 3 can eliminate the noises resulting from the capacitive coupling and the inductive coupling.

To improve symmetry and output sensitivity of the detection bridge circuit 4, it is preferable that the conductive connection arms 21a, 21b, 24a and 24b made of the soft magnetic material and the conductive connection arms 22a, 22b, 23a and 23b made of the nonmagnetic material have resistance values as equal as possible.

In this embodiment, the magnetoresistance effect films 19b and 20a sandwiched between the conductive connection arms 22a and 22b and between the conductive connection arms 23a and 23b made of the nonmagnetic material may be replaced by resistors that do not exhibit a magnetoresistance effect, respectively. In that case, it is more preferable to form the conductive connection arms 22a, 22b and 23a, 23b out of the soft magnetic material similarly to the conductive connection arms 21a, 21b and 22a, 22b since symmetry can be kept in terms of not only the geometric shape but also magnetic characteristics.

Moreover, in this embodiment, the conductive connection arms 21a, 21b; 22a, 22b; 23a, 23b; and 24a, 24b extend to outside of the exciting coil 7a or 7b. Alternatively, the ground pattern 26, the conductive pattern 27 and the output terminals 12a and 12b may extend up into the exciting coil 7a or 7b and short conductive connection arms 21a and 21b, 22a and 22b, 23a and 23b and 24a and 24b may be arranged on both sides of the magnetoresistance effect films 19a, 19b, 20a and 20b, respectively.

Figure 3:
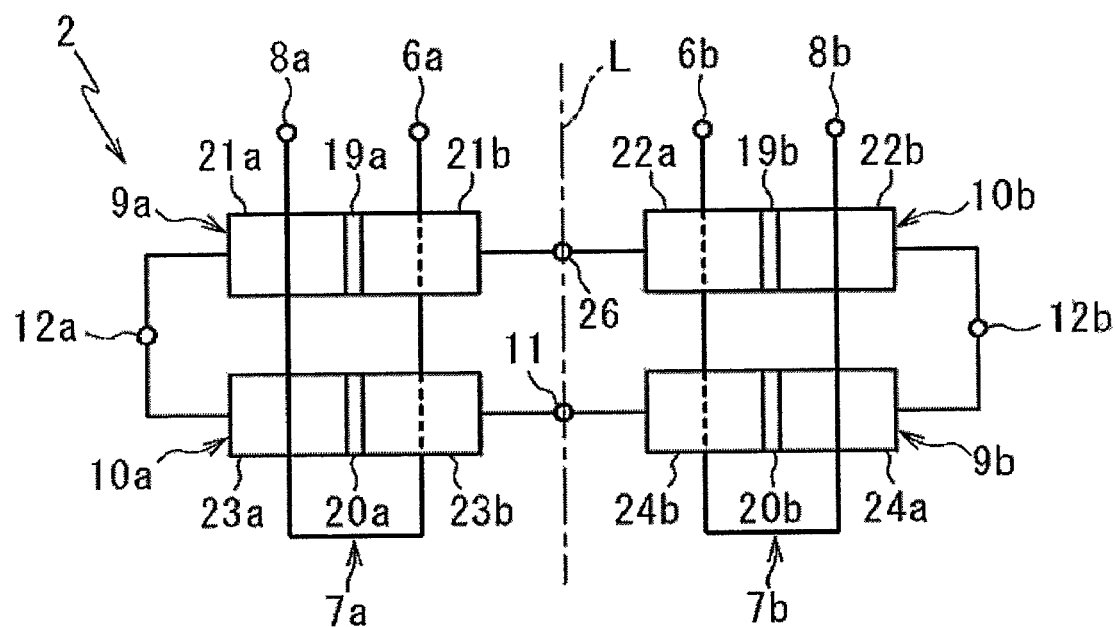
FIG. 3 is a schematic diagram of the magnetic coupler device shown in FIG. 2.

FIG. 3 shows a simplified structure of the magnetic coupler device 2 according to this embodiment. In FIG. 3, the input terminal 3 is divided into input terminals 6a and 6b at two symmetric positions. An input current connected to the same input and equal to each other is input to these input terminals 6a and 6b.

As shown in FIG. 3, it is necessary to form the magnetic coupler device 2 according to this embodiment to be line symmetric (in a mirrored fashion) about a line L connecting the power supply terminal 11 of the detection bridge circuit 5 to a ground position (ground connection layer 25).

Figure 4:
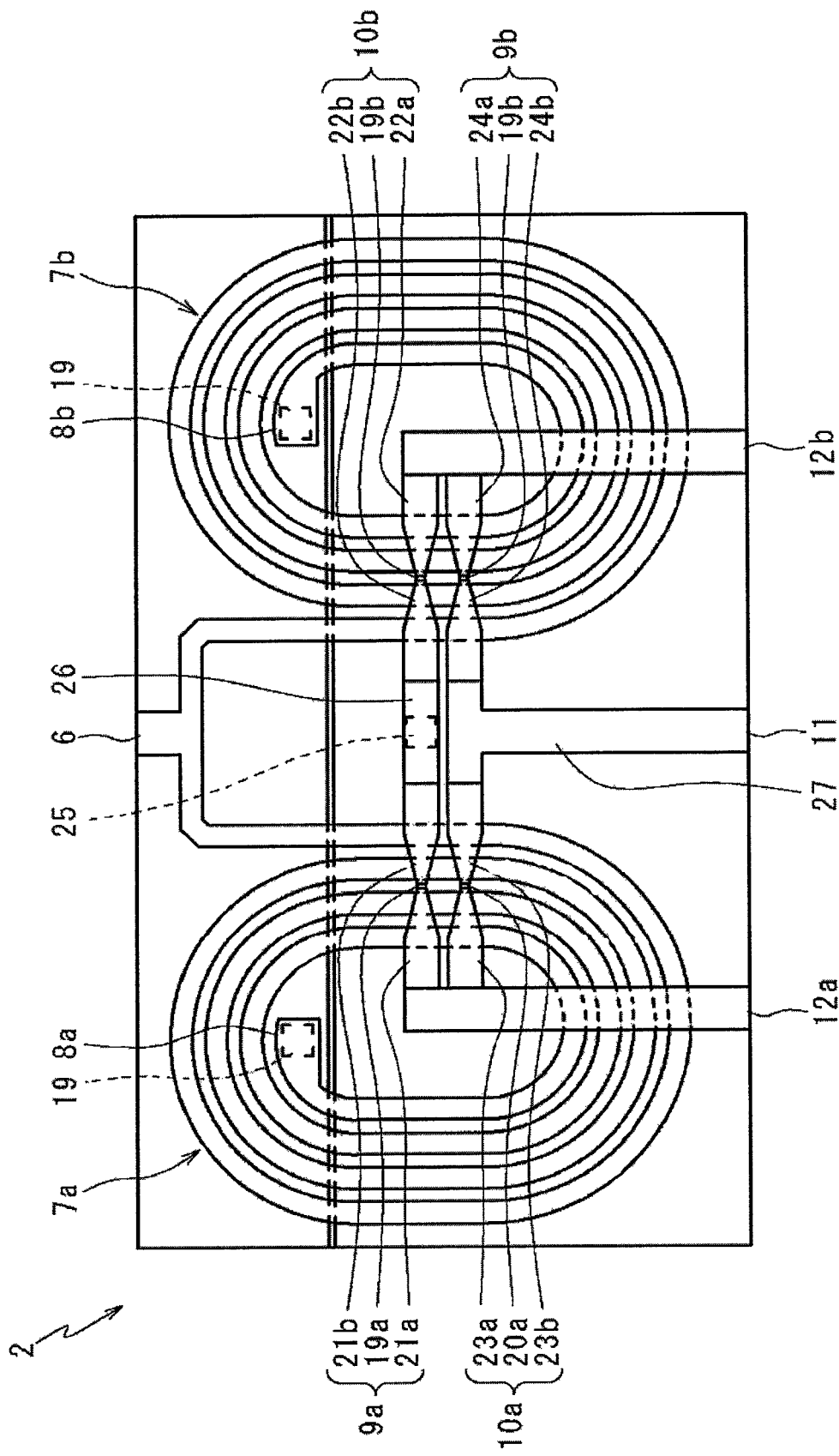
FIG. 4 is a plan view of a magnetic coupler device according to a second embodiment of the present invention.

FIG. 4 shows a magnetic coupler device 2 according to a second embodiment of the present invention. In the following description, constituent elements provided for the same purposes as those described previously are denoted by the same reference symbols and are not described, respectively.

In this embodiment, exciting coils 7a and 7b are formed out of spiral conductive patterns formed in planer configuration, respectively. However, the exciting coils 7a and 7b are similar to those according to the first embodiment in that the exciting coils 7a and 7b are formed to be line symmetric about an input terminal 6 of a magnetic field generation circuit 3, a power supply terminal 11 of a detection bridge circuit 5 and a ground connection layer 25. Furthermore, in this embodiment, output terminals 12a and 12b traverse the exciting coils 7a and 7b, respectively and extend up to an end of the magnetic coupler device 2.

In this embodiment, similarly to the first embodiment, resistance values of magnetoresistance effect films 19a and 20b change according to magnetic fields generated by the exciting coils 7a and 7b, respectively. Therefore, a voltage proportional to input current are output to between the output terminals 12a and 12b. Further, since capacitive coupling and inductive coupling to an input side seen from the output terminal 12a are identical to those seen from the output terminal 12b to the input side, noises induced to the output terminals 12a and 12b are common in mode and identical in waveform and eliminated by a differential amplifier.

Figure 5:
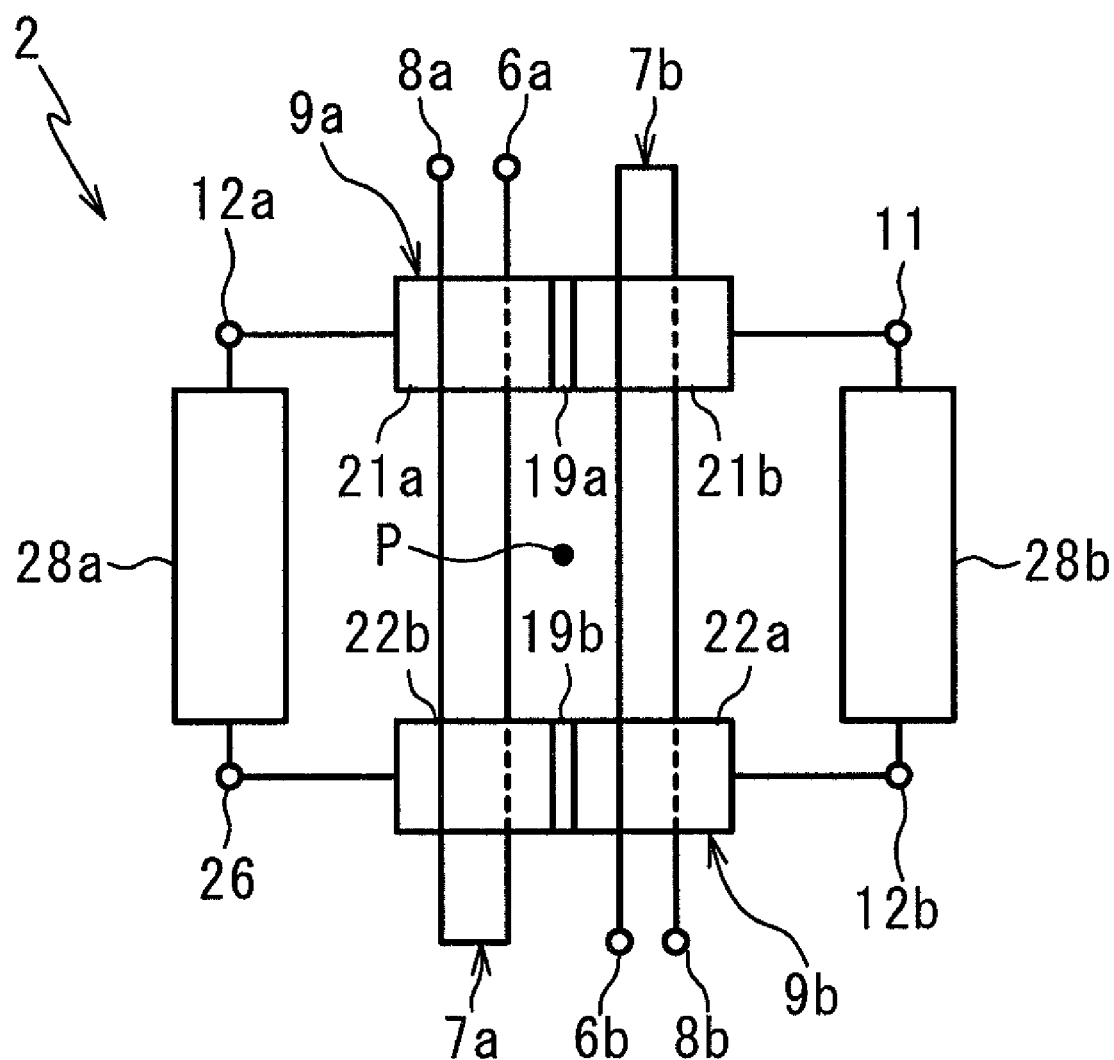
FIG. 5 is a schematic diagram of a magnetic coupler device according to a third embodiment of the present invention.

FIG. 5 is a schematic diagram of a magnetic coupler device 2 according to a third embodiment of the present invention. In this embodiment, a detection bridge circuit 5 is a Wheatstone bridge configured to include magnetoresistance effect devices 9a and 9b constituted by a pair of magnetoresistance effect films 19a and 19b sandwiched between conductive connection arms 21a and 21b and between conductive connection arms 22a and 22b, respectively and each made of a soft magnetic material, and a pair of resistors 28 a and 28b constituting fixed resistors 10a and 10b and arranged outside of exciting coils 7a and 7b, respectively.

In this embodiment, the exciting coils 7a and 7b are configured to be integrated with each other to apply a magnetic field to the magnetoresistance effect films 19a and 19b.

In this embodiment, all of the constituent elements are arranged to be point symmetric about a midpoint P between the magnetoresistance effect films 19a and 19b in a three-dimensional space. With this arrangement, similarly to the preceding embodiments, a geometric shape of a magnetic field generation circuit 4 and a detection bridge circuit seen from output terminal 12a and that seen from the output terminal 12b are relatively identical, and a differential amplifier can eliminate induced capacitive and inductive noises.

Figure 6:
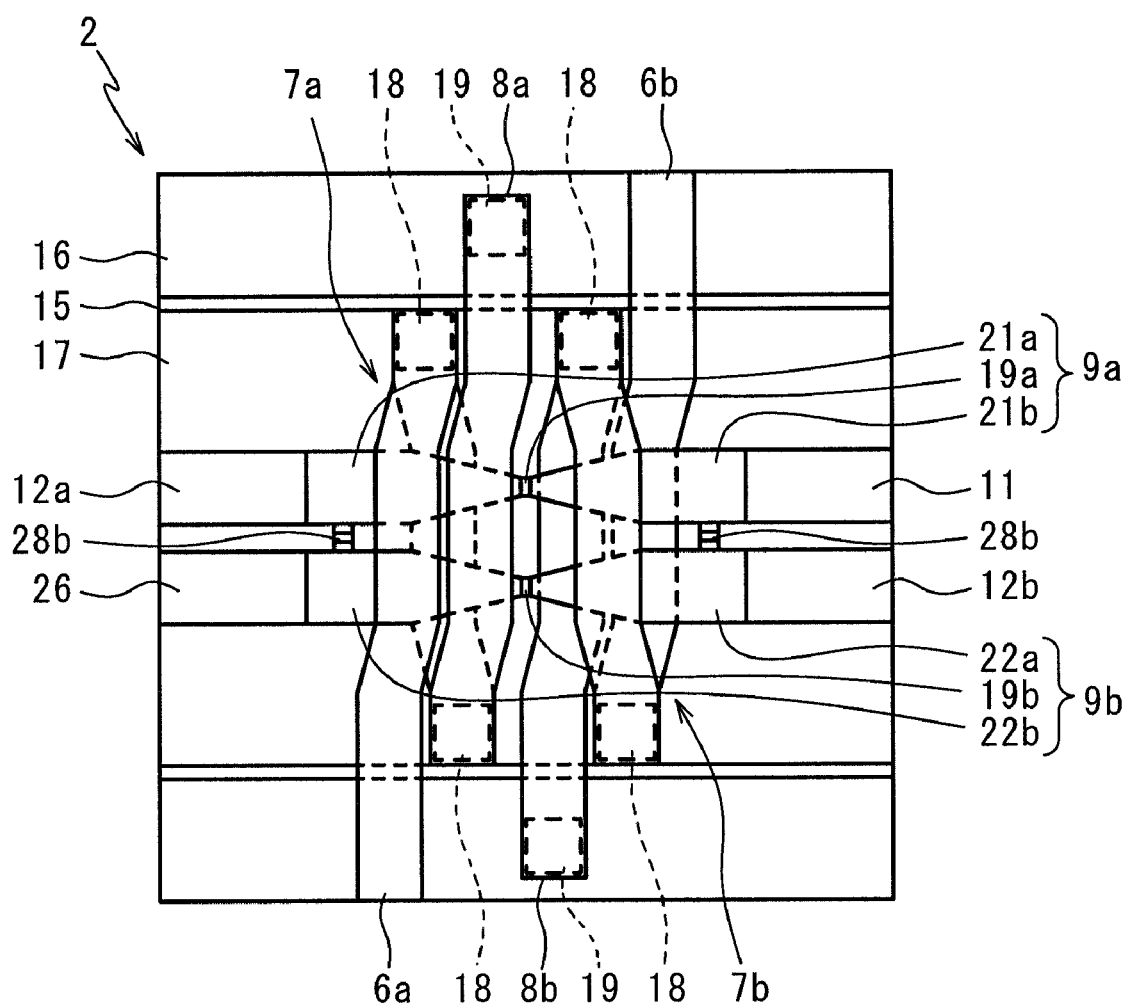
FIG. 6 is a plan view of the magnetic coupler device shown in FIG. 5.

FIG. 6 shows a specific shape of the magnetic coupler device 2 according to this embodiment. In this embodiment, input terminals 6a and 6b and ground terminals 8 a and 8b of two exciting coils 7a and 7b are arranged to be point symmetric to one another. However, magnetic fields generated by the exciting coils 7a and 7b are the same in direction. A detection bridge circuit 5 is configured so that the output terminal 12a, a power supply terminal 11, the output terminal 12b and a ground pattern 26 are provided on ends of conductive connection arms 21a, 21b, 22a and 22b, respectively, and so that the conductive connection arms 21a and 21b and the conductive connection arms 22a and 22b extend from the magnetoresistance effect films 19a and 19b to both sides of the magnetoresistance effect films 19a and 19b to be arranged in the exciting coil 7a or 7b in parallel. In addition, the conductive connection arms 21a and 22b and the conductive connection arms 21b and 22b arranged in parallel are connected to one another by the resistors 28 a and 28b outside of the exciting coils 7a and 7b, respectively.

Figure 7:
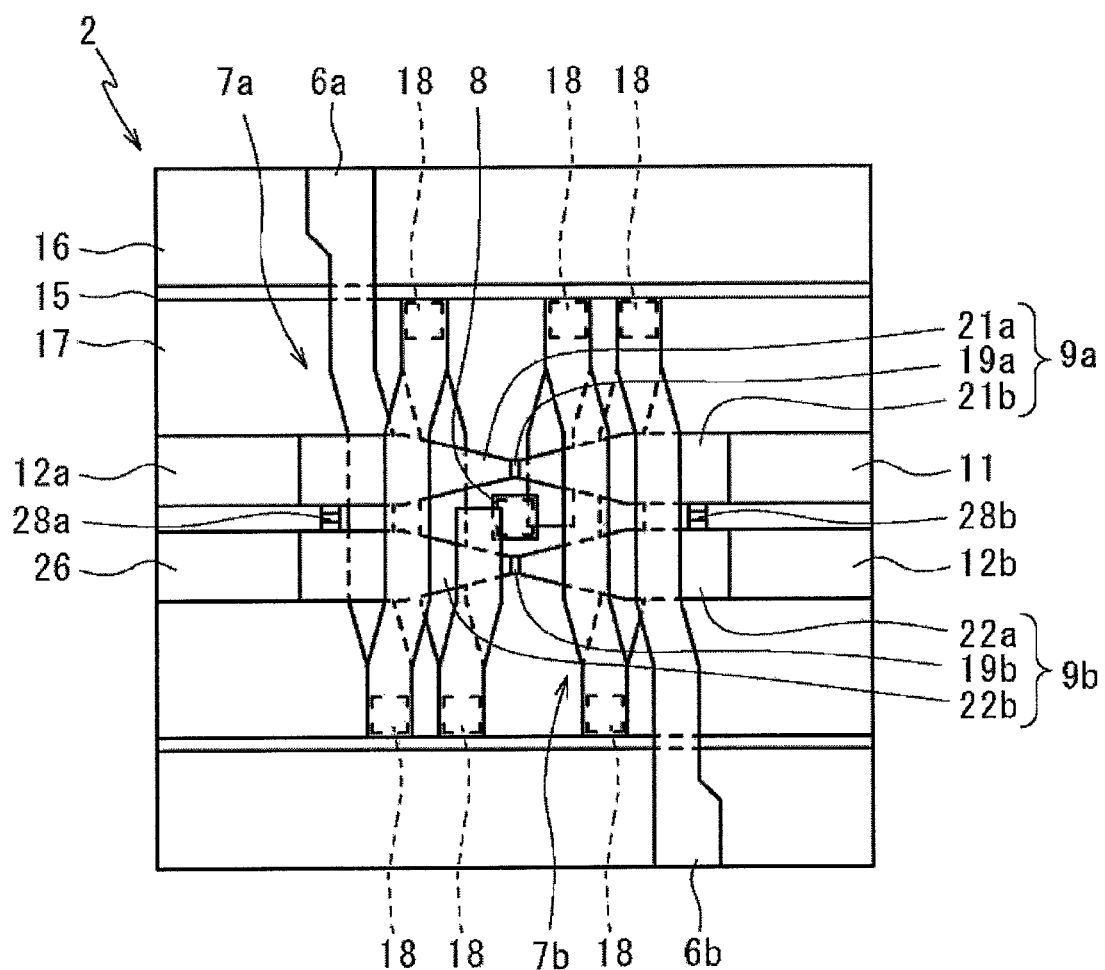
FIG. 7 is a plan view of a magnetic coupler device according to a fourth embodiment of the present invention.

FIG. 7 shows a fourth embodiment of the present invention. This embodiment is constituted by a through hole 8 obtained by arranging ground terminals 8 a and 8b of a magnetic field generation circuit 4 according to the third embodiment at a symmetric center.

In this embodiment, similarly to the third embodiment, a differential amplifier can eliminate capacitive and inductive noises induced to output terminals 12a and 12b.

Figure 8:
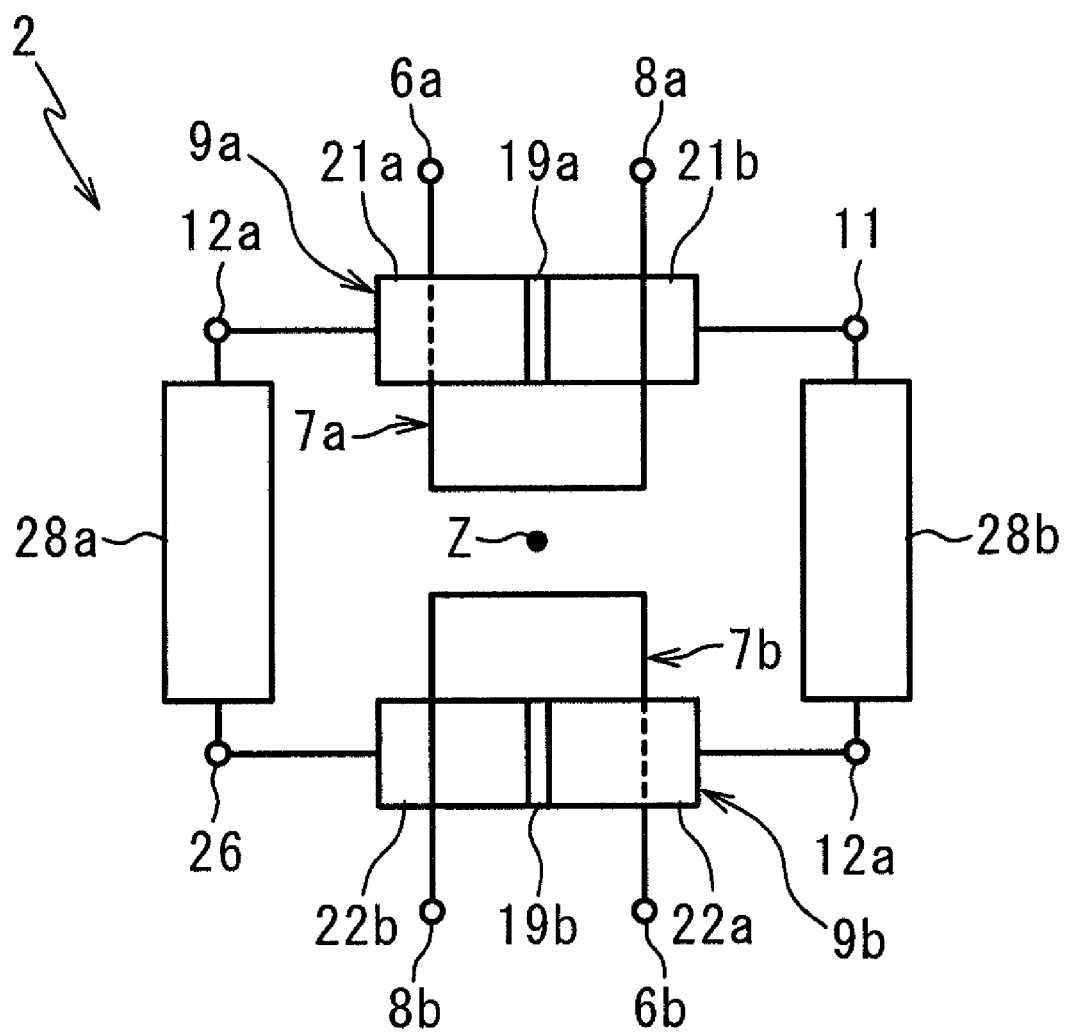
FIG. 8 is a schematic diagram of a magnetic coupler device according to a fifth embodiment of the present invention.

FIG. 8 is a schematic diagram of a magnetic coupler device 2 according to a fifth embodiment of the present invention. In this embodiment, differently from the third embodiment, all constituent elements are formed to be rotationally symmetric about a symmetric axis Z, that is, to be two-dimensionally point symmetric. Furthermore, in this embodiment, exciting coils 7a and 7b apply magnetic fields to magnetoresistance effect films 19a and 19b, respectively, independently of each other.

Figure 9:
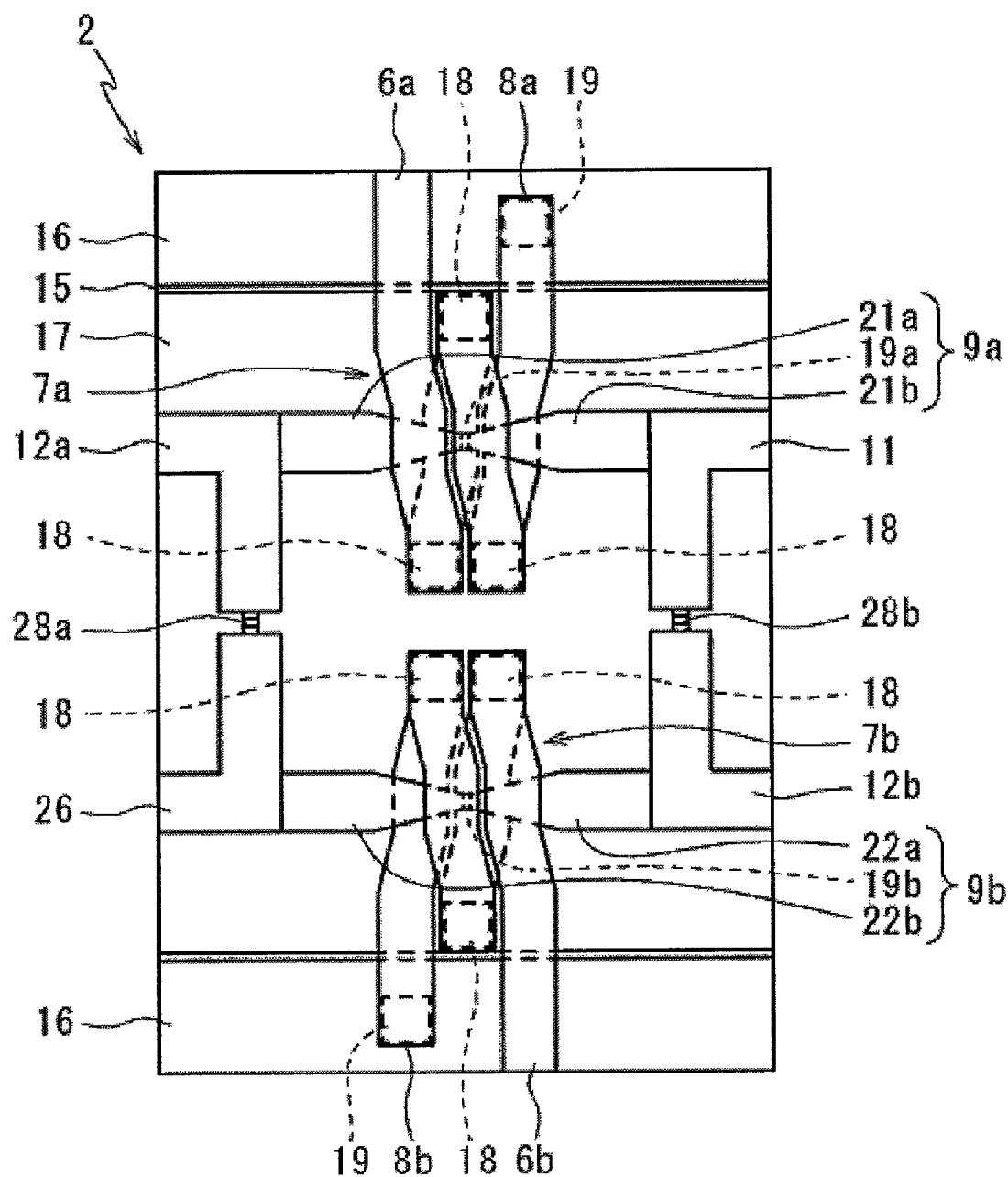
FIG. 9 is a plan view of the magnetic coupler device shown in FIG. 8.

FIG. 9 shows a specific shape of the magnetic coupler device 2 according to this embodiment. In this embodiment, the exciting coils 7a and 7b are arranged in parallel and apply the magnetic fields to the magnetoresistance effect films 19a and 19b sandwiched between conductive connection arms 21a and 21b and between conductive connection arms 22a and 22b, respectively. Moreover, resistors 28a and 28b are arranged between an output terminal 12a and a ground pattern 26 and between a power supply terminal 11 and an output terminal 12b, respectively.

As evident from the drawings, a geometric shape of a magnetic field generation circuit 4 and a detection bridge circuit 5 seen from the output terminal 12a is identical from that seen from an output terminal 12b.

Figure 10:
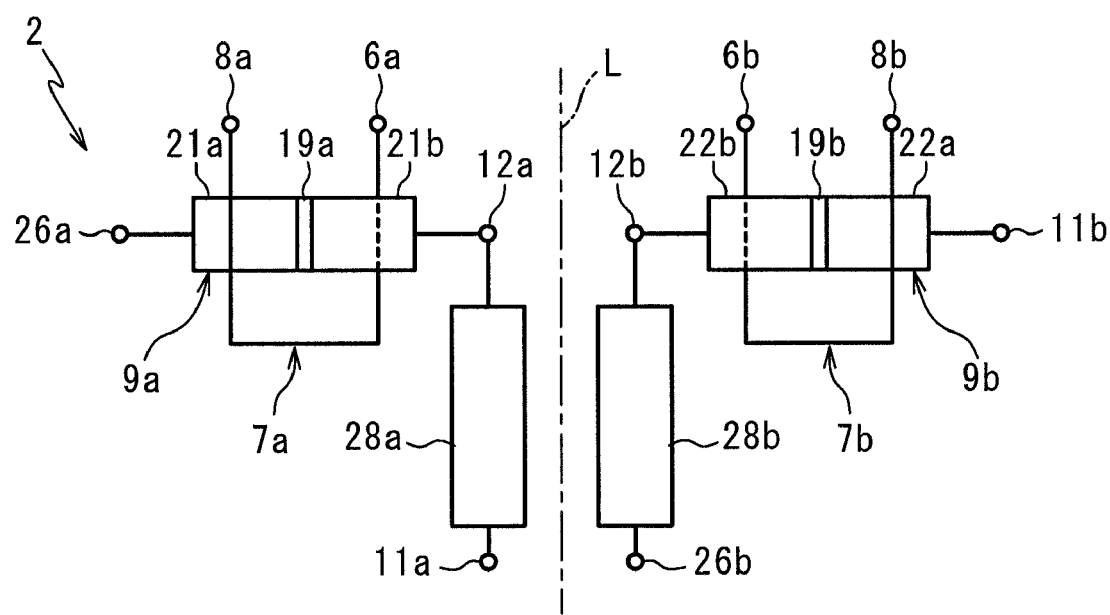
FIG. 10 is a schematic diagram of a magnetic coupler device according to a sixth embodiment of the present invention.

FIG. 10 is a schematic diagram of a magnetic coupler device 2 according to a sixth embodiment of the present invention. In this embodiment, the magnetic coupler device 2 has a geometric shape that is line symmetric (mirrored) about a symmetric line L. However, magnetoresistance films 19a and 19b sandwiched between conductive connection arms 21a and 21b and between conductive connection arms 22a and 22b, respectively and made of a soft magnetic material are not connected to resistors 28a and 28b to eventually constitute closed circuits, respectively in the magnetic coupler device 2. Instead, this embodiment is intended to complete a Wheatstone bridge by wirings arranged outside of the magnetic coupler device 2.

That is, an input terminal of a detection bridge circuit 5 and a grounded conductive pattern 26 thereof are provided to be divided into input terminals 11a and 11b and into conductive patterns 26a and 26b, respectively. By constituting an electric circuit that possibly impairs geometric symmetry of the detection bridge circuit 5 by external wirings of the magnetic coupler device 2, it is possible to facilitate making a geometric shape of a magnetic field generation circuit 4 and the detection bridge circuit 5 seen from an output terminal 12a identical to that seen from an output terminal 12b.

Figure 11:
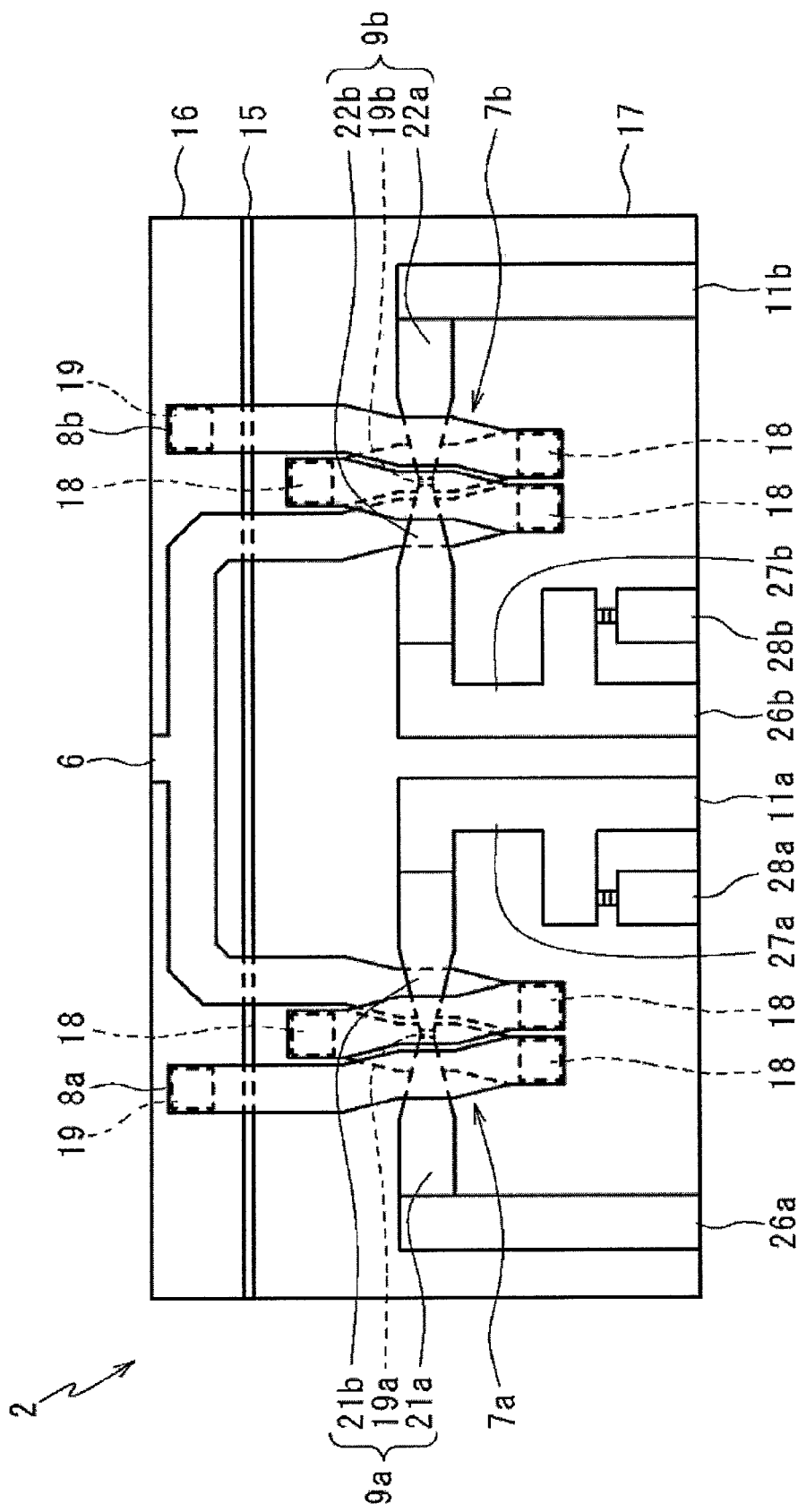
FIG. 11 is a plan view of the magnetic coupler device shown in FIG. 10.

FIG. 11 shows a specific shape of the magnetic coupler device 2 according to this embodiment. As shown in FIG. 11, all constituent elements of the magnetic coupler device 2 are arranged bilaterally symmetric. However, left and right patterns used as the input terminals 11a and 11b and those used as the ground patterns 26a and 26b differ. It is necessary that a wiring connecting the input terminal 11a to the input terminal 11b intersects with a wiring connecting the ground pattern 26a to the ground pattern 26b. If the wirings are provided on the magnetic coupler device 2, symmetry of the magnetic coupler device 2 is impaired. However, by providing the wirings outside of the magnetic coupler device 2, connection without capacitive coupling and inductive coupling can be established.

Figure 12:
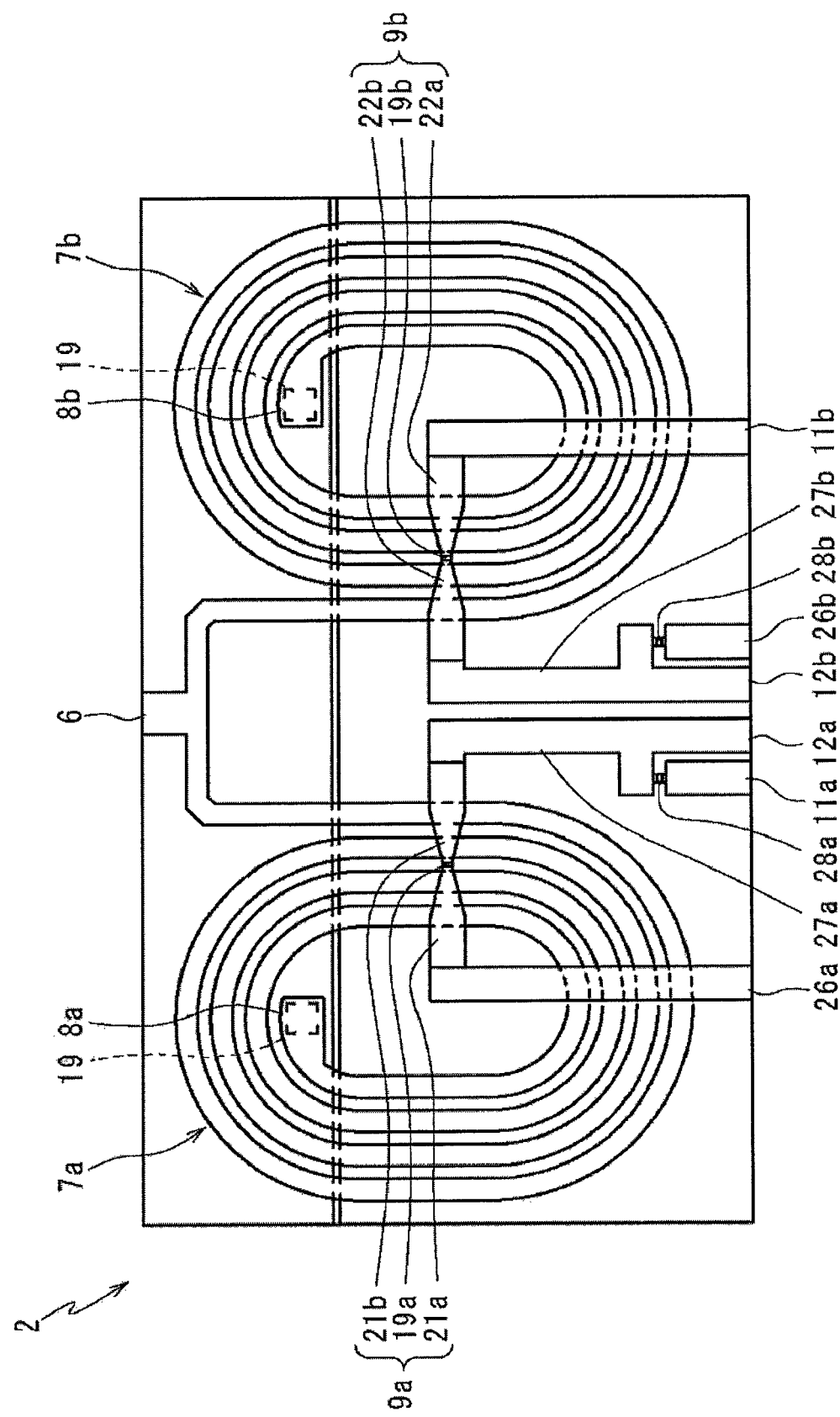
FIG. 12 is a plan view of a magnetic coupler device according to a seventh embodiment of the present invention.

Moreover, the exciting coils 7a and 7b according to the sixth embodiment can be formed into two-dimensional spiral coils, respectively as shown in FIG. 12 according to a seventh embodiment of the present invention.

Figure 13:
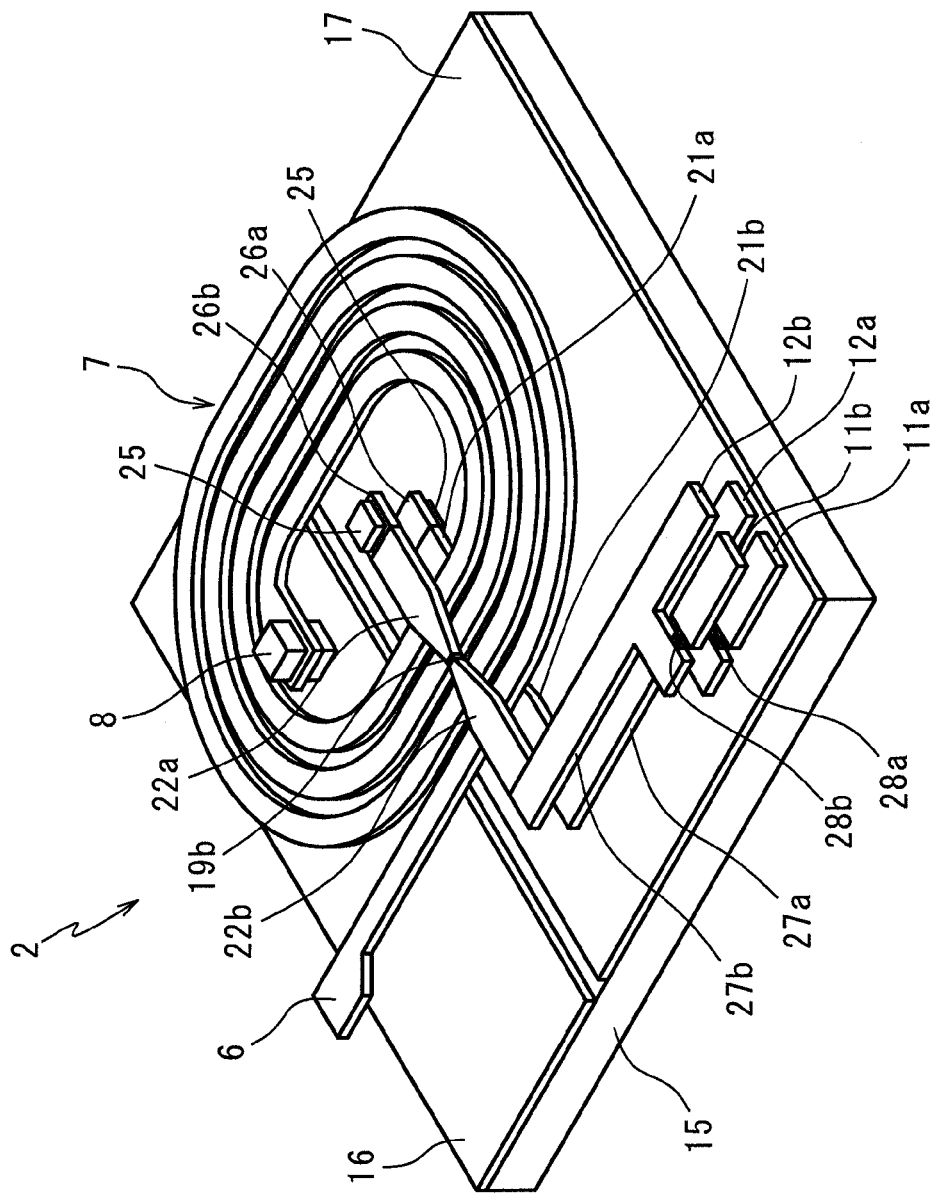
FIG. 13 is a perspective diagram of a magnetic coupler device according to an eighth embodiment of the present invention.

FIG. 13 shows a magnetic coupler device 2 according to an eighth embodiment of the present invention. In this embodiment, the magnetic coupler device 2 is obtained by bending the magnetic coupler device 2 shown in FIG. 12 on a symmetric axis L and integrally superimposing the exciting coils 7a and 7b.

That is, the magnetic coupler device 2 according to this embodiment includes one exciting coil 7 formed in planer configuration and is configured to arrange a detection bridge circuit 5, that is, to arrange magnetoresistance effect films 19a and 19b, conductive connection arms 21a and 21b and the like on both sides of the exciting coil 7, respectively so as to display symmetry.

Figure 14:
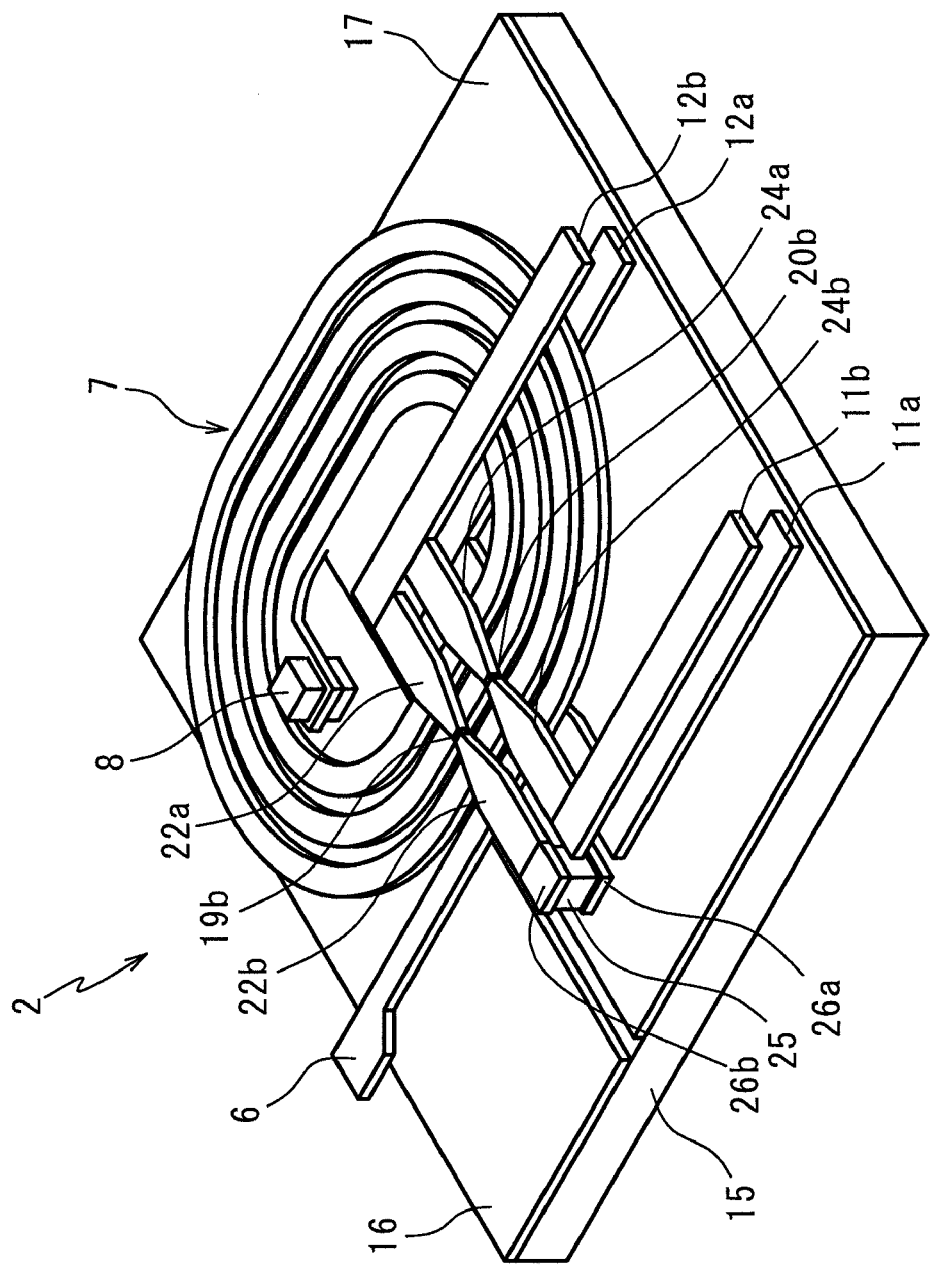
FIG. 14 is a perspective view of a magnetic coupler device according to a ninth embodiment of the present invention.

Furthermore, as shown in FIG. 14 according to a ninth embodiment of the present invention, the magnetic coupler device 2 according to the second embodiment shown in FIG. 4 may be bent on a symmetric axis L.

In the eighth and ninth embodiments, similarly to the preceding embodiments, it is quite obvious that a geometric shape of a magnetic field generation circuit 4 and a detection bridge circuit 5 seen from an output terminal 12a is identical to that seen from an output terminal 12b.

The two outputs from the magnetic coupler device 2 stated so far according to the present invention contain noise components common in mode, respectively. However, the actual differential amplifier 3 can eliminate the noises common in mode only insufficiently. A result of simulating performance of the magnetically coupled isolator 1 according to the present invention including the differential amplifier 3 is, therefore, shown below.

SIMULATION EXAMPLE

Figure 15:
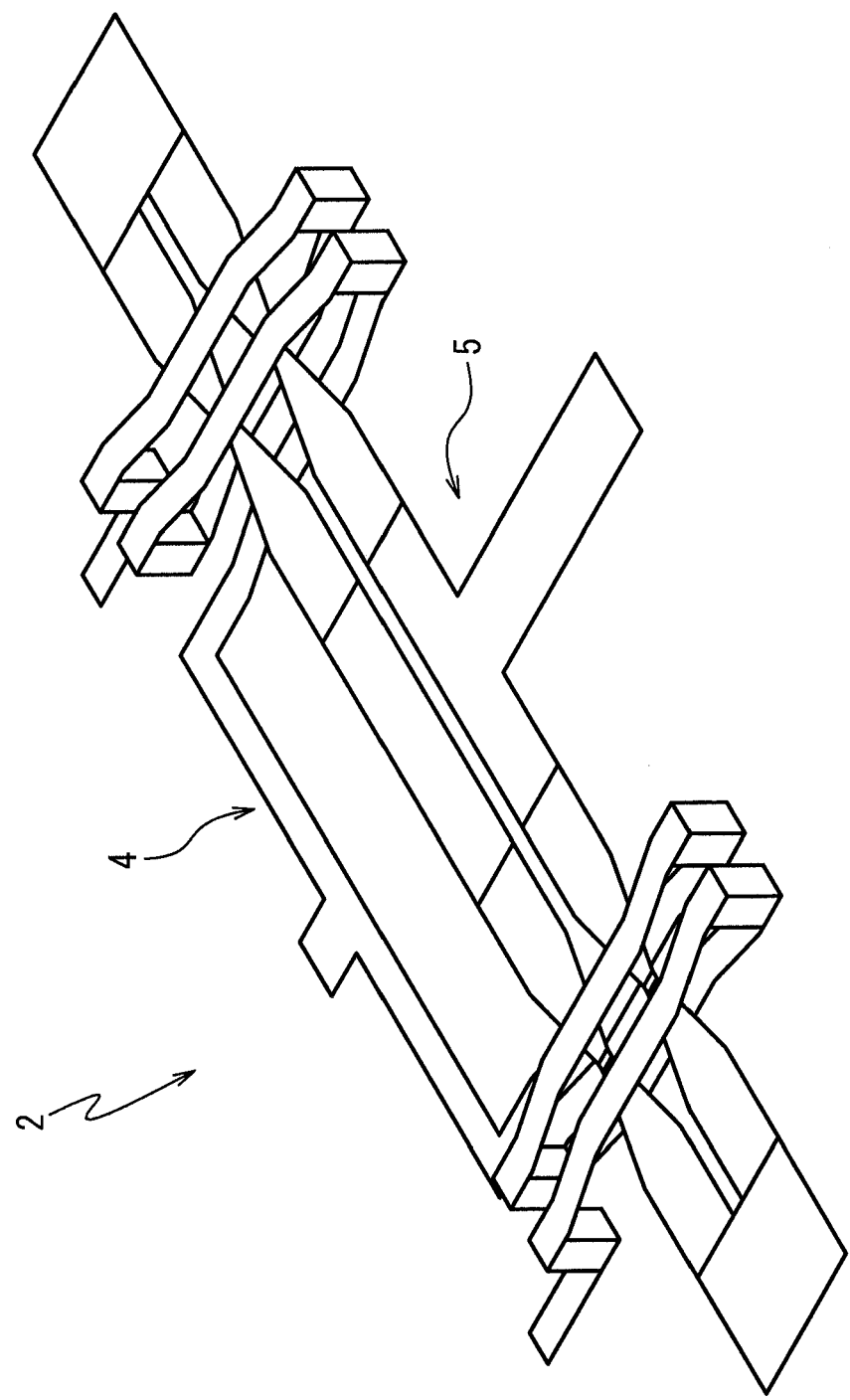
FIG. 15 shows a magnetic coupler model according to the present invention used in a simulation.
Figure 16:
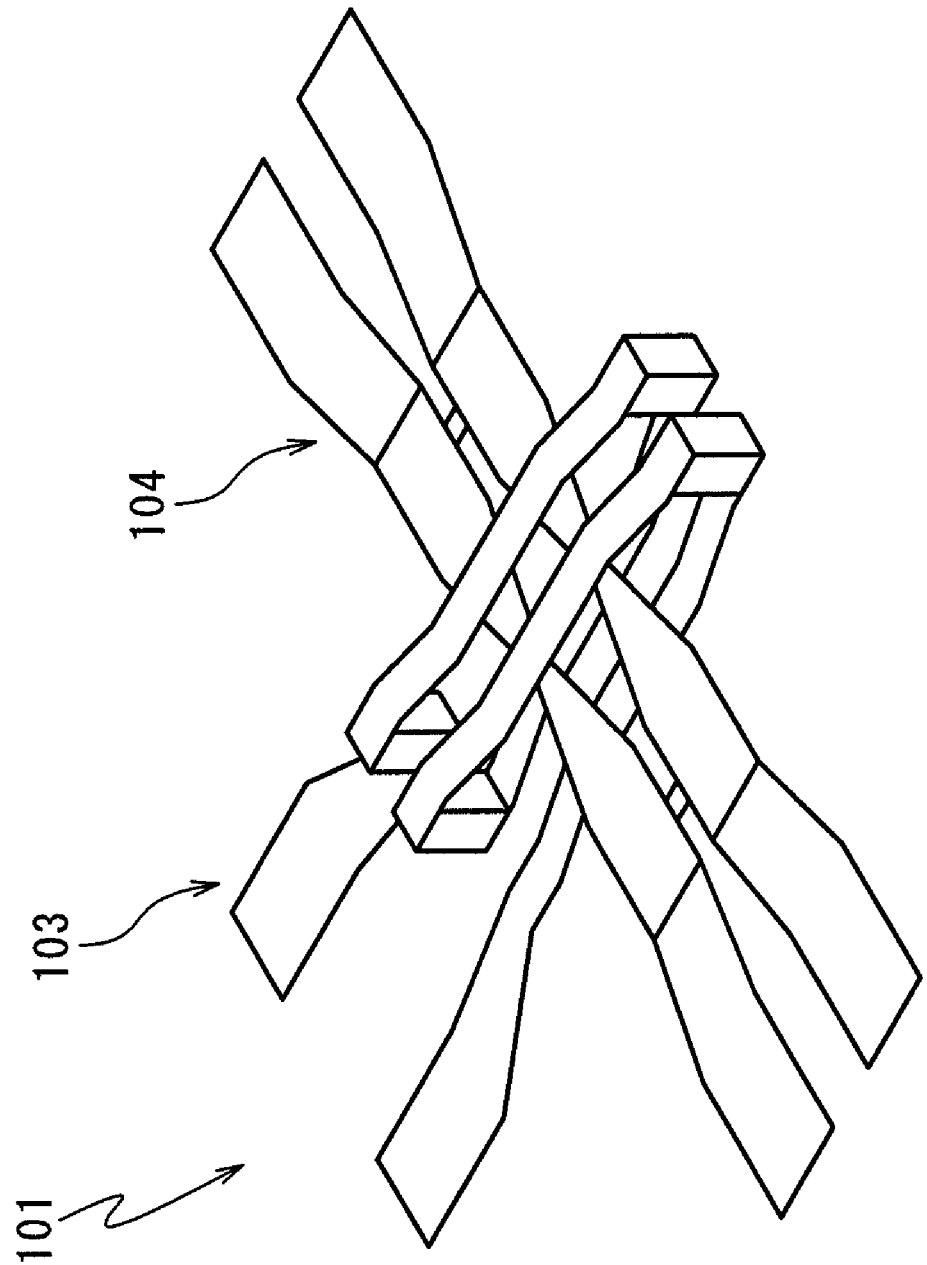
FIG. 16 shows a conventional magnetic coupler model used in the simulation.
Figure 17:
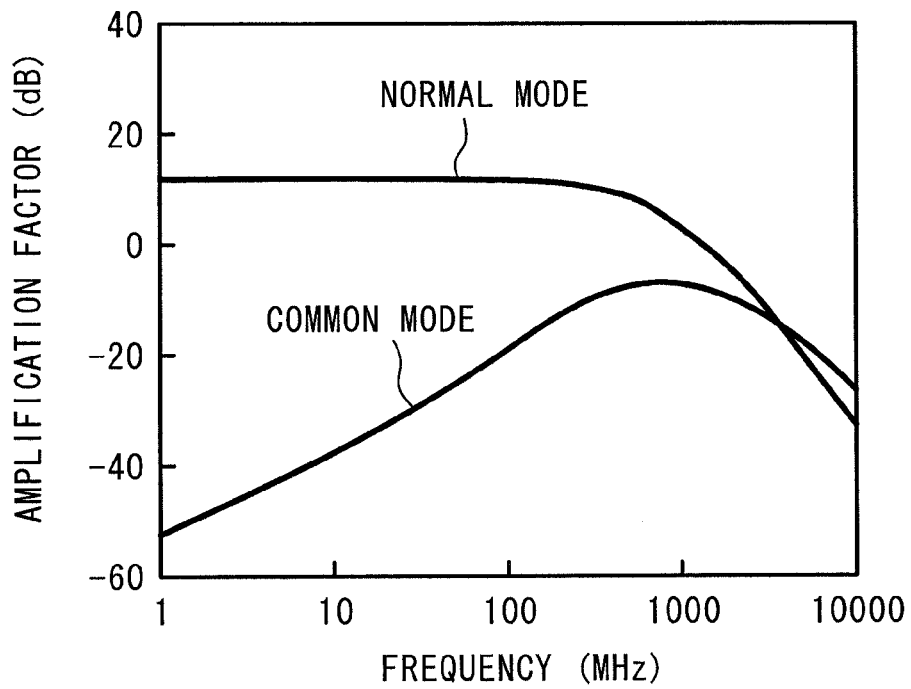
FIG. 17 is a characteristic chart of a low-frequency type differential amplifier used in the simulation.
Figure 18:
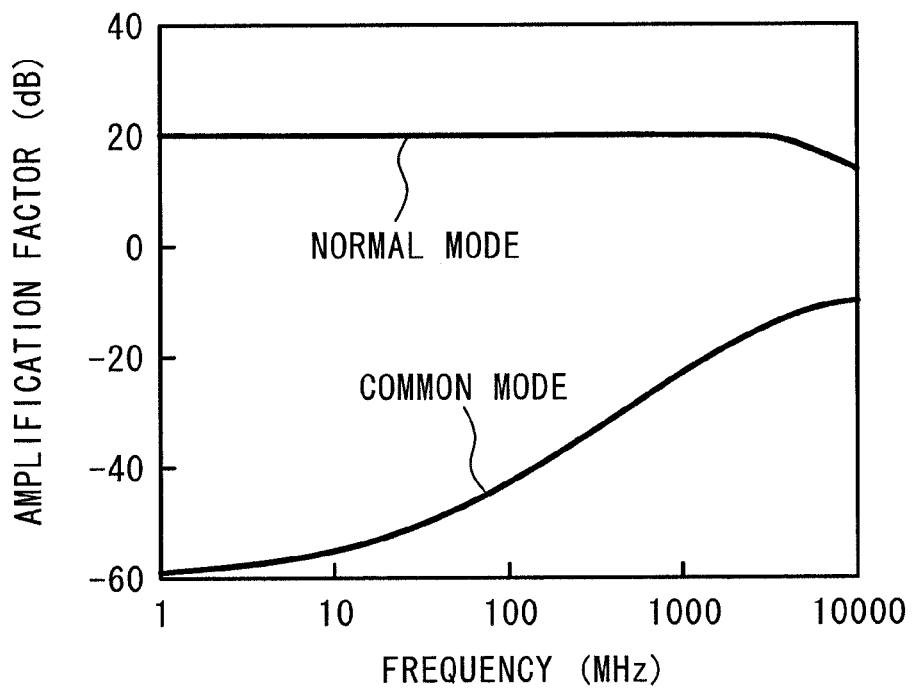
FIG. 18 is a characteristic chart of a high-frequency type differential amplifier used in the simulation.

FIGS. 15 and 16 show magnetic coupler device models used in the simulation. FIG. 15 shows the model based on the first embodiment of the present invention. FIG. 16 is the model of the conventional magnetic coupler device used for comparison. Further, FIGS. 17 and 18 show characteristics of two types of differential amplifier used in the simulation. The differential amplifier shown in FIG. 17 is a low-frequency type differential amplifier adapted to frequencies up to 800 MHz. A phase offset of the differential amplifier shown in FIG. 17 is 0.05°, delay time thereof is 0.02 nsec and total gain thereof is 11 dB. The differential amplifier shown in FIG. 18 is a high-frequency type differential amplifier adapted to frequencies up to 10 GHz. A phase offset of the differential amplifier shown in FIG. 18 is 0.006°, delay time thereof is 0.001 nsec and total gain thereof is 20 dB.

Figure 19:
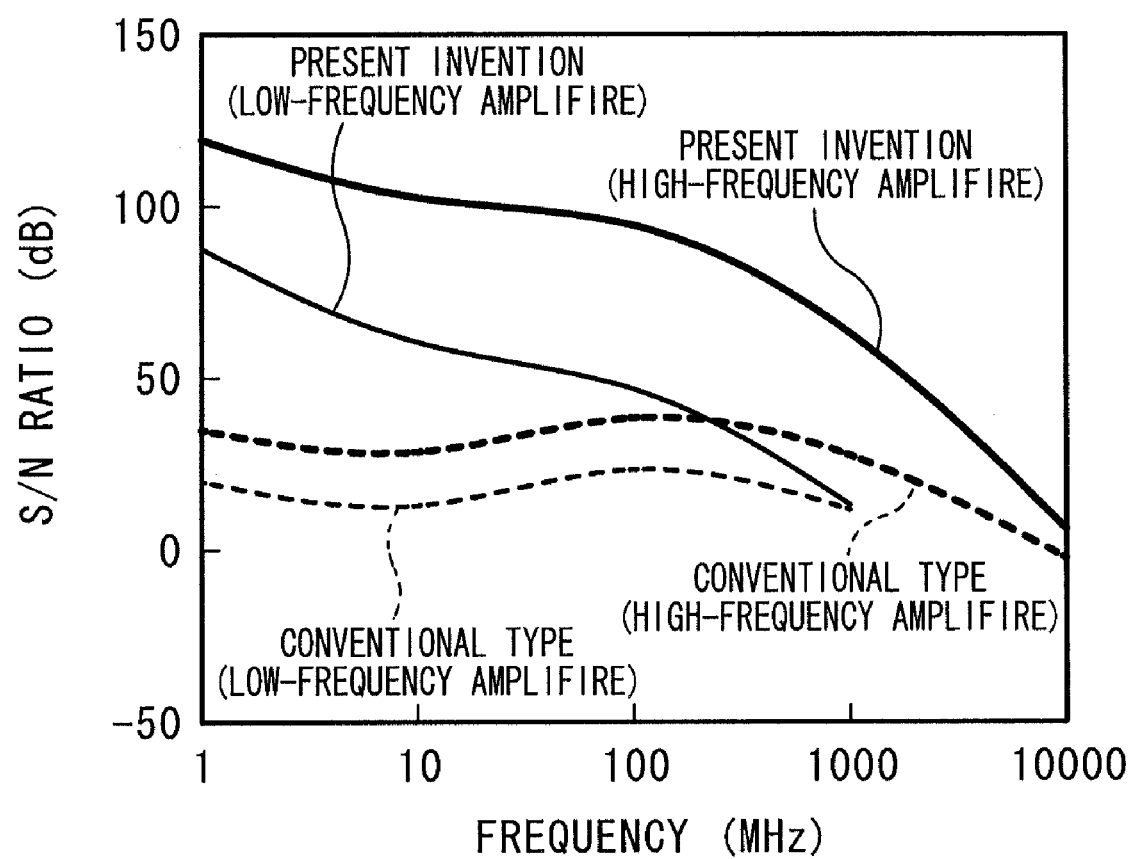
FIG. 19 is a graph showing a result of the simulation of magnetically coupled isolators.
Figure 20:
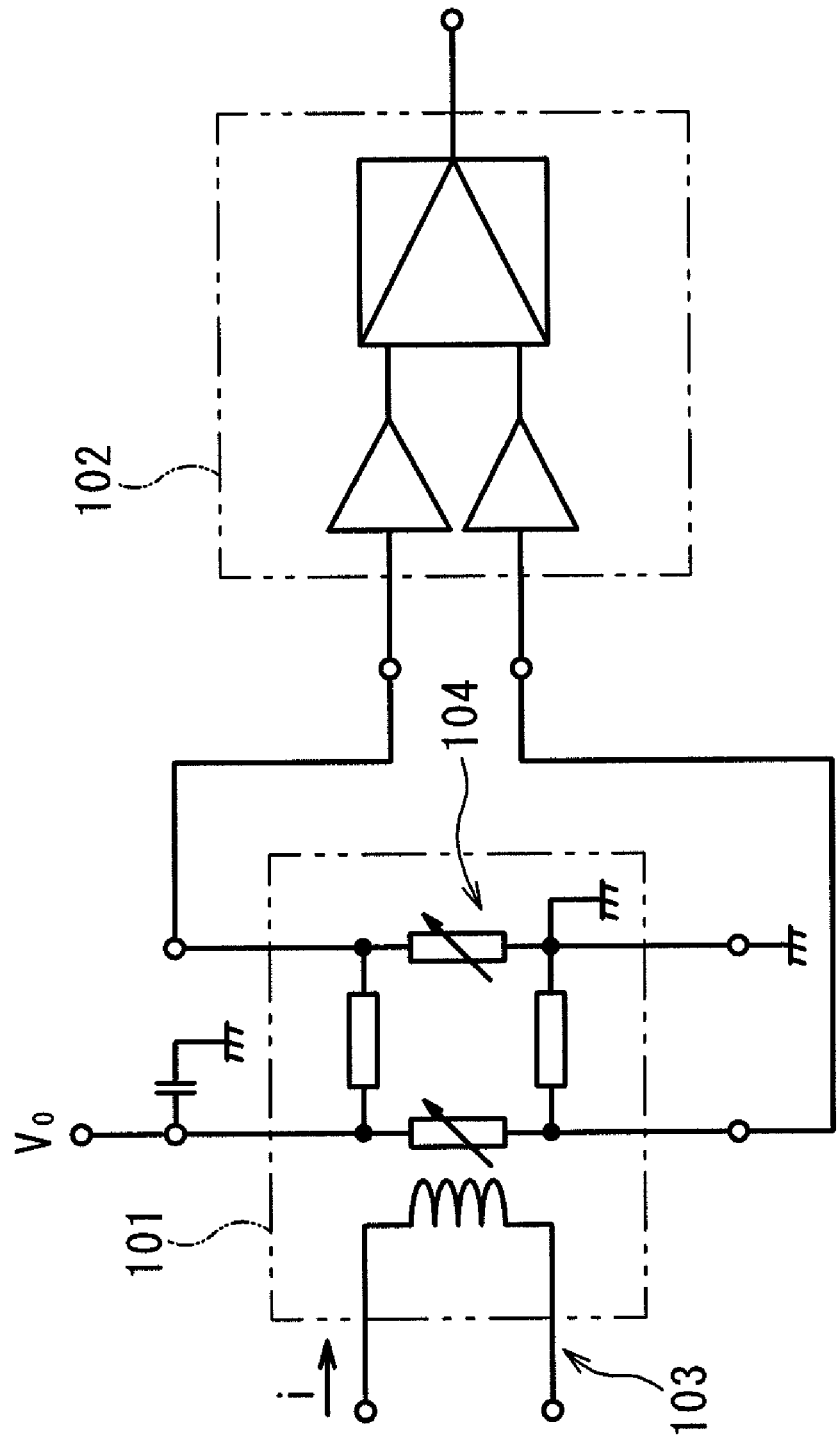
FIG. 20 is a circuit diagram of a conventional magnetically coupled isolator.

FIG. 19 shows the S/N ratio frequency characteristics obtained as a result of analyses using an electromagnetic field analysis simulator for above-stated combinations of the magnetic coupler device and the differential amplifier, respectively.

As shown in FIG. 19, if the magnetic coupler device according to the present invention is used, it is possible to reduce noise level and increase the S/N ratio as compared with an instance of using the conventional magnetic coupler. An effect of reducing the noise level is more conspicuous particularly if frequency is lower. Nevertheless, the noise level in a high frequency range is sufficiently low to be workable in regions in which the respective differential amplifiers are used.

The embodiments have been described so far on the premise of forming a thin film coil or thin film coils on the substrate by the photolithographic technique. Alternatively, a coil obtained by winding a conductor around the substrate manually, mechanically or the like may be used as an input coil.

The invention claimed is:
1. A magnetic coupler device comprising:
   a magnetic field generation circuit generating a magnetic field according to an input current; and
   a detection bridge circuit including a pair of magnetoresistance effect devices, a resistance value of each of the magnetoresistance effect devices changing by applying a magnetic field generated by said magnetic field generation circuit to each of the magnetoresistance effect devices, and having two outputs between which a volt- age difference is generated according to an intensity of the magnetic field generated by said magnetic field generation circuit, wherein a geometric shape of each of said magnetic field generation circuit and said detection bridge circuit is formed to be line symmetric or point symmetric, wherein said magnetic field generation circuit includes two exciting coils electrically connected to each other and having geometric shapes symmetric to each other, and wherein one end of each of said two exciting coils is connected to same electrode and said two exciting coils are formed to be line symmetric about a line passing said electrode.

2. A magnetically coupled isolator comprising:
the magnetic coupler device according to claim 1; and
a differential amplifier outputting a difference between the two outputs of said detection bridge circuits.

3. The magnetically coupled isolator according to claim 2, comprising:
buffer amplifiers amplifying the two outputs of said detection bridge circuit, respectively.

4. A magnetic coupler device comprising:
a magnetic field generation circuit generating a magnetic field according to an input current
a detection bridge circuit including a pair of magnetoresistance effect devices, a resistance value of each of the magnetoresistance effect devices changing by applying a magnetic field generated by said magnetic field generation circuit to each of the magnetoresistance effect devices, and having two outputs between which a voltage difference is generated according to an intensity of the magnetic field generated by said magnetic field generation circuit and
a pair of conductive connection arms extending from said magnetoresistance effect film in opposite directions to each other, arranged in the magnetic field generated by said magnetic field generation circuit, and each made of a soft magnetic material,
wherein a geometric shape of each of said magnetic field generation circuit and said detection bridge circuit is formed to be line symmetric or point symmetric,
wherein each of said magnetoresistance effect devices is configured to include a magnetoresistance effect film,
wherein said detection bridge circuit includes a pair of fixed resistors,
wherein said magnetoresistance effect devices and said fixed resistors are arranged symmetrically in geometry, and
wherein each of said fixed resistors is configured to include
a pair of magnetoresistance effect films; and
a pair of conductive connection arms extending from the magnetoresistance effect films in opposite directions, respectively, arranged in the magnetic field generated by said magnetic field generation circuit, and each made of a nonmagnetic material.

5. The magnetic coupler device according to claim 4,
wherein said detection bridge circuit includes said pair of fixed resistors connected to said conductive connection arms, respectively outside of said magnetic field generation circuit, and
said detection bridge circuit is formed to be point symmetric about a midpoint between said pair of said magnetoresistance effect films.

6. The magnetic coupler device according to claim 4,
wherein said detection bridge circuit includes said pair of fixed resistances connected to said conductive connection arms, respectively outside of said magnetic field generation circuit, and
said detection bridge circuit is formed to be line symmetric about a line connecting said pair of said magnetoresistance effect films.

7. The magnetic coupler device according to claim 4,
wherein said magnetoresistance effect film is formed out of a nanogranular material containing metal and an insulator.

8. A magnetic coupler device comprising:
a magnetic field generation circuit generating a magnetic field according to an input current; and
a detection bridge circuit including a pair of magnetoresistance effect devices, a resistance value of each of the magnetoresistance effect devices changing by applying a magnetic field generated by said magnetic field generation circuit to each of the magnetoresistance effect devices, and having two outputs between which a voltage difference is generated according to an intensity of the magnetic field generated by said magnetic field generation circuit,
wherein a geometric shape of each of said magnetic field generation circuit and said detection bridge circuit is formed to be line symmetric or point symmetric
wherein said magnetic field generation circuit includes an exciting coil formed planer configuration,
wherein said detection bridge circuit is arranged symmetrically on each of both sides of said exciting coil,
wherein each of said magnetoresistance effect devices is configured to include a magnetoresistance effect film; and
a pair of conductive connection arms extending from said magnetoresistance effect film in opposite directions to each other, arranged in the magnetic field generated by said magnetic field generation circuit, and each made of a soft magnetic material, and
wherein said bridge detection circuit includes a pair of fixed resistors, each of said fixed resistors includes:
a pair of magnetoresistance effect films; and
a pair of conductive connection arms extending from said magnetoresistance effect films in opposite directions to each other, respectively, arranged in the magnetic field generated by said magnetic field generation circuit, and each made of a nonmagnetic material, and
said magnetoresistance effect films and said fixed resistors are arranged symmetrically on both sides of said exciting coils.

9. The magnetic coupler device according to claim 8,
wherein said detection bridge circuit includes said pair of fixed resistors connected to said conductive connection arms, respectively outside of said magnetic field generation circuit, and
said detection bridge circuit is formed symmetrically on each of both sides of said exciting coil.

10. The magnetic coupler device according to claim 8,
wherein said magnetoresistance effect film is formed out of a nanogranular material containing metal and an insulator.

\* \* \* \* \*